(12) United States Patent
Beall et al.

(10) Patent No.: US 9,936,611 B1
(45) Date of Patent: Apr. 3, 2018

(54) MODULAR MASS STORAGE SYSTEM

(71) Applicant: Amazon Technologies, Inc., Reno, NV (US)

(72) Inventors: Christopher Strickland Beall, Woodinville, WA (US); David Edward Bryan, Seattle, WA (US); Darin Lee Frink, Seattle, WA (US); Jason Alexander Harland, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 263 days.

(21) Appl. No.: 14/217,121

(22) Filed: Mar. 17, 2014

(51) Int. Cl.
*H05K 7/20* (2006.01)
*H05K 7/14* (2006.01)
*B21D 39/00* (2006.01)

(52) U.S. Cl.
CPC ......... *H05K 7/20736* (2013.01); *B21D 39/00* (2013.01); *H05K 7/1488* (2013.01)

(58) Field of Classification Search
CPC ... H05K 7/20736; H05K 7/1488; B21D 39/00
See application file for complete search history.

(56) References Cited

U.S. PATENT DOCUMENTS

| | | | | |
|---|---|---|---|---|
| 5,150,277 A * | 9/1992 | Bainbridge | ............ | H05K 7/206 361/695 |
| 6,234,591 B1 * | 5/2001 | Driscoll | .................. | G06F 1/184 312/223.1 |
| 6,459,571 B1 * | 10/2002 | Carteau | .................... | G06F 1/184 312/35 |
| 6,506,111 B2 * | 1/2003 | Sharp | .................. | H05K 7/20754 165/122 |
| 6,775,137 B2 * | 8/2004 | Chu | .................... | H05K 7/20754 165/120 |
| 6,955,062 B2 * | 10/2005 | Tilton | ........................ | F28D 5/00 257/E23.1 |
| 7,085,133 B2 * | 8/2006 | Hall | .................... | H05K 7/20572 361/695 |
| 7,200,008 B1 | 4/2007 | Bhugra | | |

(Continued)

OTHER PUBLICATIONS

U.S. Appl. No. 14/217,154, filed Mar. 17, 2014, David Edward Bryan.

(Continued)

*Primary Examiner* — David M Sinclair
*Assistant Examiner* — Theron S Milliser
(74) *Attorney, Agent, or Firm* — Robert C. Kowert; Meyertons, Hood, Kivlin, Kowert & Goetzel, P.C.

(57) ABSTRACT

A system for storing data includes a rack and one or more data storage modules mounted on the rack. The data storage modules may include a chassis, two or more vertically-oriented backplanes coupled to the chassis, two or more mass storage devices coupled to the backplanes, and one or more air passages extending beneath one or more of the backplanes. Each backplane is configured to preclude airflow through the backplane between opposite vertical faces and can couple mass storage devices on one or more of the opposite vertical faces. One or more of the air passages can supply an upwards-directed airflow along one of the opposite vertical faces of a backplane to remove heat from a heat producing component of a mass storage device coupled to the vertical face of the vertically-oriented backplane.

19 Claims, 12 Drawing Sheets

(56) References Cited

U.S. PATENT DOCUMENTS

| | | | |
|---|---|---|---|
| 7,359,186 B2 | 4/2008 | Honda et al. | |
| 7,508,663 B2 * | 3/2009 | Coglitore | H05K 7/20736 165/122 |
| 7,869,210 B2 * | 1/2011 | Moss | H05K 7/20836 361/694 |
| 8,028,793 B2 * | 10/2011 | Bard | A47B 97/00 181/198 |
| 8,154,870 B1 * | 4/2012 | Czamara | H05K 7/20736 361/694 |
| 8,191,841 B2 * | 6/2012 | Jeffery | G11B 33/02 165/104.13 |
| 8,331,095 B2 | 12/2012 | Hu et al. | |
| 2004/0057203 A1 * | 3/2004 | Rabinovitz | G06F 1/184 361/679.31 |
| 2004/0218355 A1 * | 11/2004 | Bash | H05K 7/20745 361/690 |
| 2005/0057898 A1 | 3/2005 | El-Batal et al. | |
| 2005/0237716 A1 * | 10/2005 | Chu | H05K 7/20745 361/696 |
| 2006/0187634 A1 | 8/2006 | Tanaka et al. | |
| 2007/0053169 A1 | 3/2007 | Carlson et al. | |
| 2007/0091559 A1 | 4/2007 | Malone | |
| 2007/0233781 A1 * | 10/2007 | Starr | G11B 33/126 709/203 |
| 2009/0144568 A1 | 6/2009 | Fung | |
| 2010/0134972 A1 * | 6/2010 | Moss | H05K 7/20736 361/679.49 |
| 2011/0255237 A1 * | 10/2011 | Doll | G06F 1/20 361/679.46 |
| 2012/0243170 A1 * | 9/2012 | Frink | G06F 1/187 361/679.34 |
| 2014/0078668 A1 * | 3/2014 | Goulden | H05K 7/20736 361/679.47 |

OTHER PUBLICATIONS

U.S. Appl. No. 14/217,149, filed Mar. 17, 2014, David Edward Bryan.

U.S. Appl. No. 14/217,124, filed Mar. 17, 2014, David Edward Bryan.

* cited by examiner

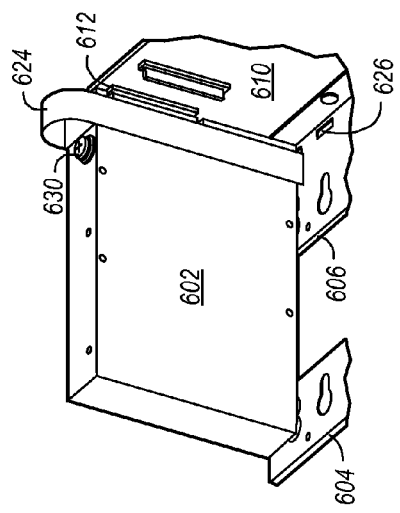
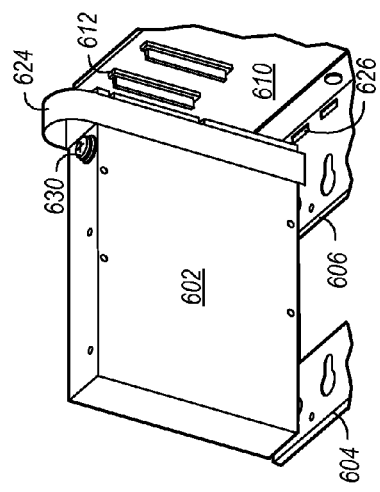
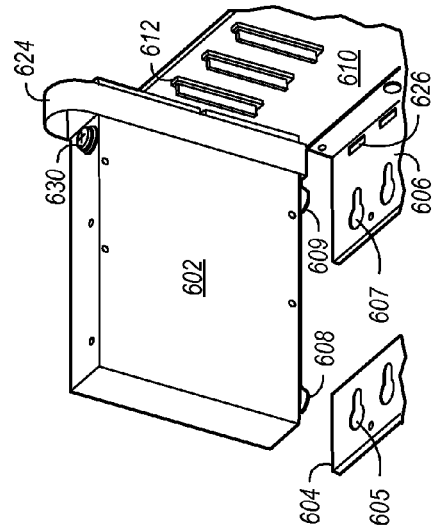
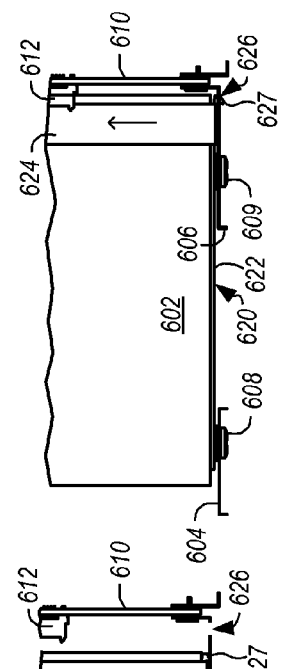
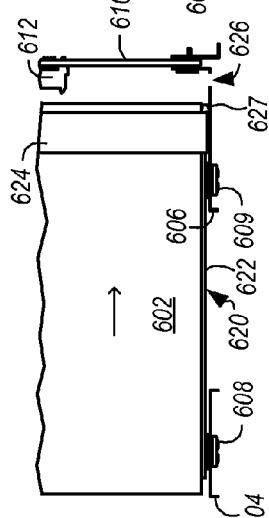
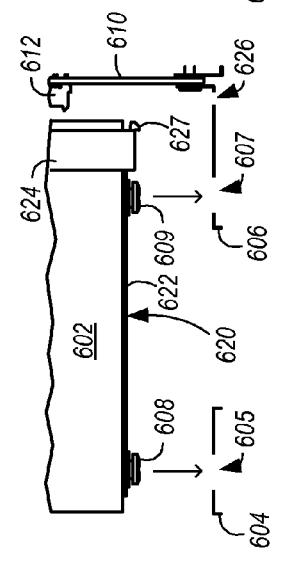
FIG. 6A  FIG. 6B  FIG. 6C
FIG. 7A  FIG. 7B  FIG. 7C

MODULAR MASS STORAGE SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times. Heat may be removed from the hard disk drives via an air flow through a server.

In some cases, cooling systems, including air moving systems, may be used to induce an airflow through one or more portions of a data center, including an airflow through a rack that includes various heat producing components. However, some configurations of various equipment in a rack, including various servers and associated equipment, may result in some of the induced airflow through a rack bypassing one or more of the heat producing components in the rack. In some cases, airflows bypassing one or more various heat producing components may result in suboptimal utilization of at least some of the induced airflow to remove heat from heat producing components in the rack, and may represent suboptimal airflow through one or more rack computing systems, including one or more servers. Suboptimal airflow through a server may hinder heat removal from various heat producing components in the server, including hard disk drives, which may negatively affect server operations.

BRIEF DESCRIPTION OF THE DRAWINGS

FIG. 6A-C illustrate installing a mass storage device on a backplane according to some embodiments.

FIG. 7A-C illustrate installing a mass storage device on a backplane according to some embodiments.

Figure 1A:
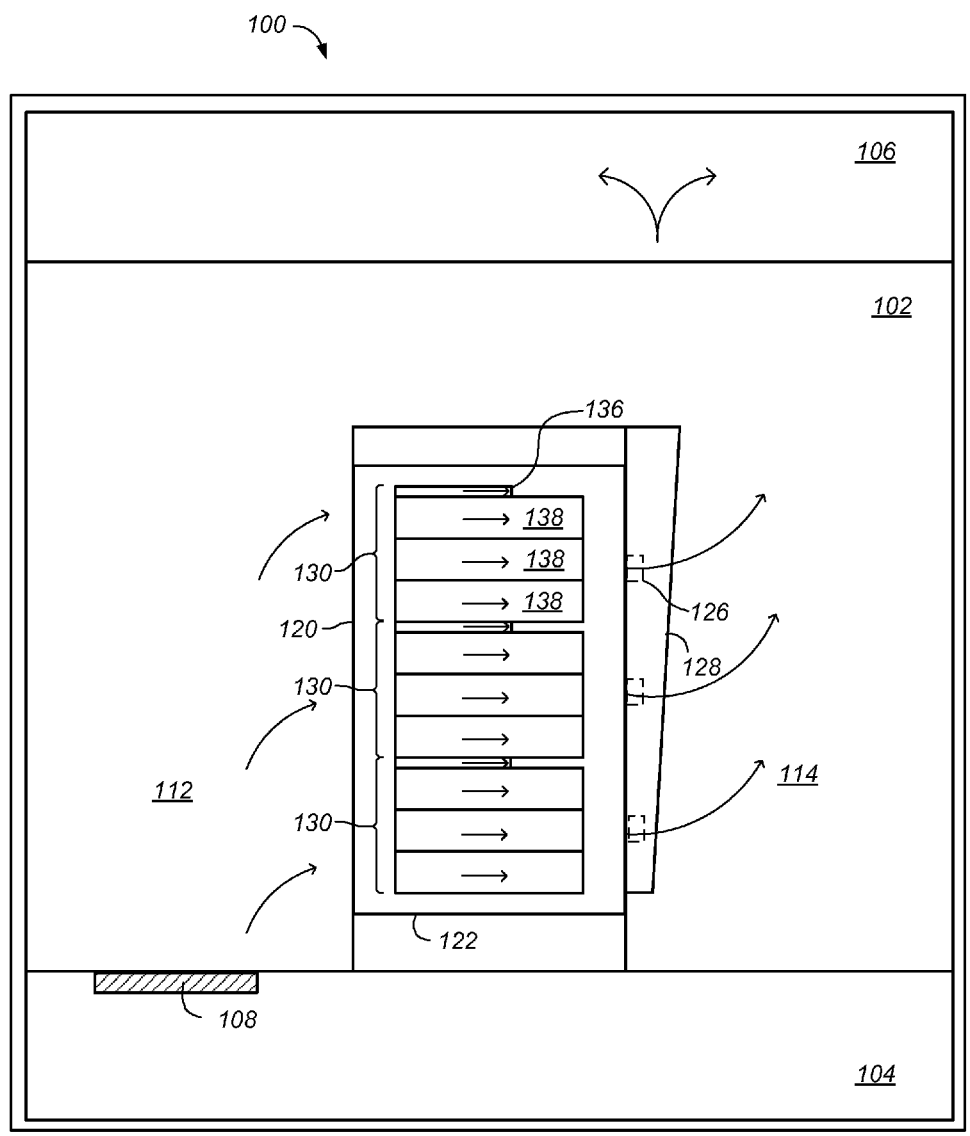
FIG. 1A-B are each schematic diagrams illustrating a side view of data storage subsystems in a rack system and further illustrate removal of heat from data storage modules in the rack system according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a system for storing data includes a rack and one or more data storage modules mounted on the rack. The data storage modules may include a chassis that at least partially encompasses a chassis interior, two or more vertically-oriented backplanes coupled to the chassis in the chassis interior, two or more mass storage devices coupled to separate and opposite vertical faces of at least one of the two or more backplanes, and one or more air passages extending beneath at least one of the backplanes from the inlet end towards the exhaust end of the chassis. The one or more air passages each supply an upwards-directed airflow along at least one of the opposite vertical faces of a vertically-oriented backplane to remove heat from at least one heat producing component of one or more mass storage devices coupled to the vertical face.

According to one embodiment, a data storage module includes a chassis, two or more vertically-oriented backplanes coupled to the chassis, and one or more air passages extending beneath at least one of the backplanes from an inlet end to an exhaust end of the chassis. The chassis at least partially encompasses a chassis interior. Each of the backplanes precludes airflow through the respective backplane between opposite vertical faces and is also configured to couple with at least one mass storage device on at least one of opposite vertical faces of the respective backplane. The air passages are each configured to supply an upwards-directed airflow along at least one of the opposite vertical faces of a backplane to remove heat from at least one heat producing component of at least one mass storage device coupled to the vertical face.

According to one embodiment, a method of providing data storage includes coupling two or more vertically-oriented backplanes to a chassis in a chassis interior at least partially encompassed by the chassis. Each vertically-oriented backplane can couple with at least one mass storage devices on at least one of opposite vertical faces backplane and preclude airflow through the backplane between the opposite vertical faces, such that each vertical face can direct an upwards-directed airflow along the vertical face to remove heat from at least one heat producing component of at least one mass storage device coupled to the vertical face.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "backplane" means a plate or board to which other electronic components, such as mass storage devices, circuit boards, can be mounted. In some embodiments, mass storage devices, which can include on or more hard disk drives, are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, "installing" a particular element on another element refers to physically coupling the elements such that the particular element is communicatively coupled with at least the other element. Installing the elements can include electrically coupling the elements via physically coupling an electrical connector of the particular element with a complementary electrical connector of the other element. Installing a particular element to another element can include electrically coupling a portion of the particular element to a portion of the other element and mounting another potion of the particular element to another portion of the other element.

As used herein, "primarily horizontal", also interchangeably referred to hereinafter as "horizontally-oriented", means at least more horizontal than vertical. In the context of an installed element or device, "primarily horizontal" or "horizontally-oriented" includes an element or device whose installed width is greater than its installed height. In some embodiments, a horizontally-oriented element or device is fully horizontal.

As used herein, "primarily vertical", also interchangeably referred to hereinafter as "vertically-oriented", means at least more vertical than horizontal. In the context of an installed element or device, "primarily vertical" or "vertically-oriented" includes an element or device whose installed height is greater than its installed width. In the context of a hard disk drive, "primarily vertical" or "vertically-oriented" includes a hard disk drive that is installed such that the installed height of the hard disk drive is greater than the installed width of the hard disk drive. In some embodiments, a vertically-oriented element or device is fully vertical.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "shock absorbing", as applied to a supporting element for another element, means that the supporting element absorbs mechanical energy and/or at least partially mitigates shock and/or vibration loads. A shock-absorbing material may be elastic, viscoelastic, viscous, or combinations thereof.

Figure 1B:
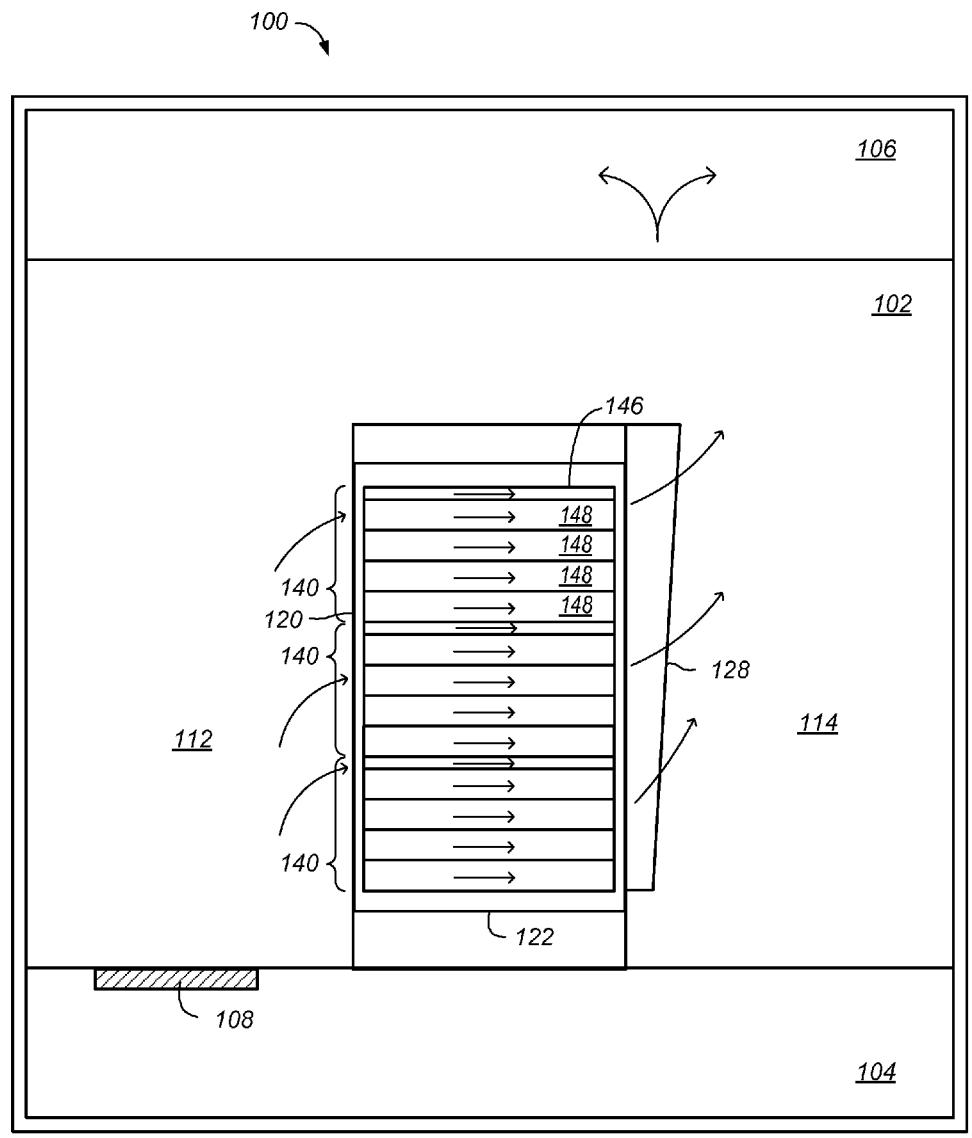

FIG. 1A-B are each schematic diagrams illustrating a side view of data storage subsystems in a rack system and further illustrate removal of heat from data storage modules in the rack system according to some embodiments.

In some embodiments, a rack includes two or more data storage subsystems having vertically-oriented mass storage devices. FIG. 1A is a schematic diagram illustrating a side view of three data storage subsystems 130 in a rack interior 122 of rack 120. Data storage subsystems 130 each include a data control module 136 and three data storage modules 138 mounted on one or more portions of the rack 120. In each of data storage subsystems 130, data control module 136 may control, and access data on, data storage modules 138. In some embodiments, data storage modules 138 include two or more horizontally-oriented backplanes carrying vertically-oriented mass storage devices, which may include one or more mass storage devices. For example, data storage modules 138 may each include 6 backplanes and 16 mass storage devices arranged thereupon each, such that each data storage module 138 includes 96 mass storage devices. Each data storage module 138 may have a rack height of 4U, and data control module 136 may have a rack height of 1U. As a result, the rack interior 122 of rack 120 in FIG. 1A may include three subsystems 130, each occupying a space of 13U in rack height for a total occupied space with a height of 39U in the rack interior 122 and a total number of mass storage devices included in the three subsystems 130 of 864 mass storage devices. In various embodiments, data storage modules and data control modules may be any suitable height. In various embodiments, one or more subsystems of data control modules and data storage modules may include various ratios of devices. For example, in some embodiments, a data storage subsystem may include one data control module and one data storage module. As shown, the modules 136, 138 may not occupy the entirety of rack interior 122 space at the given elevation at which each module is mounted on the rack, such that additional components may be mounted on the rack at the same given elevation, including one or more air moving devices 126, rack-level power distribution units, etc. In some embodiments, including the illustrated embodiment, a data control module 136 may occupy a reduced length of the rack interior 122 relative to data storage modules 138.

In some embodiments, a rack includes two or more data storage subsystems having horizontally-oriented oriented mass storage devices. FIG. 1B is a schematic diagram illustrating a side view of three data storage subsystems 140 in a rack interior 122 of rack 120. Data storage subsystems 140 each include a data control module 146 and three data storage modules 148 mounted on one or more portions of rack 120. In each of data storage subsystems 140, data control module 146 may control, and access data on, data storage modules 148. In some embodiments, data storage modules 148 include two or more vertically-oriented backplanes carrying horizontally-oriented mass storage devices, which may include one or more hard disk drives. One or more of the vertically-oriented backplanes may couple with mass storage devices on each of opposite vertical faces of the backplane. For example, data storage modules 148 may each include 3 vertically-oriented backplanes and 16 mass storage devices coupled to each of two opposite vertical faces of each backplane, such that each data storage module 148 includes at least 96 mass storage devices, similarly to data storage modules illustrated below with regard to FIG. 2-13. Because horizontally-oriented mass storage devices may occupy a reduced amount of vertical space relative to vertically-oriented mass storage devices, each data storage module 148 may have a rack height of 3U, compared with a 4U rack height of data storage module 138 illustrated and discussed above with reference to FIG. 1A, and data control module 146 may have a rack height of 1U. In addition, each data control module 146 may include one or more vertically-oriented backplanes, to which multiple additional mass storage devices may be coupled on each of opposite vertical faces. As a result, the rack interior 122 of rack 120 in FIG. 1B may include three subsystems 140, each occupying a space of 13U in rack height for a total occupied space with a height of 39U in the rack interior 122 and a total number of mass storage devices included in the data storage modules 148 of the three subsystems 140 of 1152 mass storage devices. In addition, where each data control module 148 includes six additional mass storage devices, as illustrated below with regard to FIG. 10, the rack interior of rack 120 in FIG. 1B may include a total number of 1170 mass storage devices using 39U of rack height. In various embodiments, one or more subsystems of data control modules and data storage modules may include various ratios of devices. For example, in some embodiments, a data storage subsystem may include one data control module and three data storage module, and a rack may include four subsystems for a total occupied space with a height of 40U in the rack interior 122.

As shown, the modules 146, 148 may occupy substantially an entirety of rack interior 122 space at the given elevation at which each module is mounted on the rack, such that certain additional components are precluded from being mounted on the rack 120 at the same given elevation, including one or more air moving devices external to the modules, rack-level power distribution units, etc. In some embodiments, a data control module 146 may occupy a reduced length of the rack interior 122 relative to data storage modules 148.

As a result of the illustrated difference in total mass storage devices included in racks with data storage modules having vertically-oriented mass storage devices and extending substantially entirely through a given elevation of the rack interior, as illustrated in FIG. 1A-B, a rack 102 in which subsystems of 3U data storage modules with vertically-oriented backplanes and 1U data control modules with data storage portions, as illustrated for example below with regard to FIG. 2-13, may enable a given rack interior 122 of a given height of rack space, including 39U of rack height, to accommodate a greater number of mass storage devices relative to a rack in which 4U data storage modules with horizontally-oriented backplanes and extending through a portion of the rack interior at a given elevation, are coupled.

FIG. 1A-B illustrate embodiments of removal of heat from data storage modules in a rack system. In each of the illustrated embodiments, air may flow into computing room 102 of data center 100 from sub-floor plenum 104 by way of vent 108. In some embodiments, such as illustrated in FIG. 1A, where the rack 120 includes an interior 122 into which multiple subsystems each comprising 4U data storage modules 138 and 1U data control modules 136 are coupled, rear fans 126 in fan door 128 may draw air from front aisle 112, also referred to as an "inlet" aisle, into rack 120, and through data storage modules 138 and data control modules 136 coupled in the rack interior 122. Rear fans 126 may exhaust heated air ("exhaust air") out of the rack. The heated air may be exhausted into rear aisle ("exhaust aisle") 114. The heated air may flow into ceiling plenum 106.

In some embodiments, such as illustrated in FIG. 1B, where the rack 120 includes an interior 122 into which multiple subsystems 140 each comprising 3U data storage modules 148 and 1U data control modules 146 with data storage portions are coupled, each of the modules 146, 148 may include one or more air moving devices, which may include one or more rear air fans, air blowers, etc. may draw air from front aisle 112, also referred to as an "inlet" aisle and through the respective module 146, 148 in which the air moving device is included. The air moving devices may each exhaust heated air ("exhaust air") out of the respective module 146, 148. The heated air may be exhausted into rear aisle ("exhaust aisle") 114. The heated air may flow into ceiling plenum 106. Air directing device 124 is provided on the front of rack 120. Air directing device 124 may be used to promote airflow in particular modules mounted in the rack. Other arrangements of air movers may be included in various embodiments. U.S. patent application Ser. No. 12/646,417, "Air Directing Device for Rack System", filed Dec. 23, 2009; U.S. patent Ser. No. 12/751,212, "Rack-Mounted Air Directing Device with Scoop", filed Mar. 30, 2010; and U.S. patent application Ser. No. 12/886,440, "System with Rack-Mounted AC Fans", filed Sep. 9, 2010, each of which is incorporated by reference as if fully set forth herein, include other arrangements, systems, devices, and techniques that may be used in various embodiments for cooling or mounting computing modules, data storage modules and data control modules.

Figure 2:
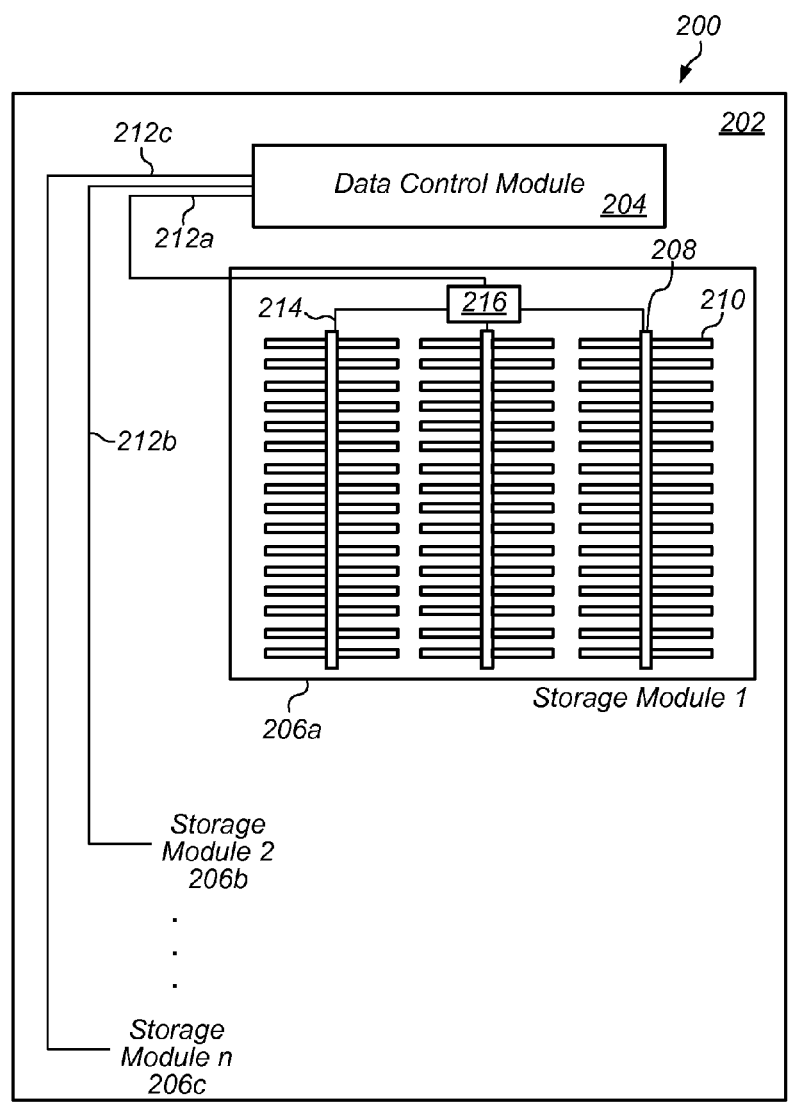
FIG. 2 is a block diagram illustrating a system, including a data control module and data storage modules in a rack, according to some embodiments.

In various embodiments, a data storage system includes one or more data storage modules that are accessed from, and controlled by, a data controller external to the data storage modules. In some embodiments, a data control module and one or more data storage modules coupled to the data control module are included within a rack. FIG. 2 is a block diagram illustrating a system, including a data control module and data storage modules in a rack, according to some embodiments. System 200 includes rack 202, data control module 204, and data storage modules 206. Data control module 204 and data storage modules 206 are included in rack 202.

Mass storage devices 210 in data storage modules 206 are communicatively coupled to data control module 204. Data control module 204 may access data on any or all of the mass storage devices in data storage modules 206a, 206b, and 206c. In some embodiments, data control module 204 is mounted in an interior of one or more of the data storage modules 206.

In various embodiments, a data storage module includes two or more circuit boards, each of which carry, and provide electrical connections for, multiple mass storage devices. In some embodiments, one or more of the circuit boards in a data storage module are coupled to a chassis of the module in a primarily vertical orientation, also referred to as being "vertically-oriented". For example, in the embodiment illustrated in FIG. 2, data storage module 206 includes vertically-oriented backplane circuit board assemblies 208, also referred to herein as vertically-oriented "backplanes". Backplanes 208 carry mass storage devices 210. Backplanes 208 may provide power, data, and signal connections for mass storage devices 210. In some embodiments, one or more portions of a backplane 208, including a vertically-oriented component of the backplane, is coupled with a mass storage device 210 to provide at least some structural load support of the mass storage device 210 in the data storage module 206. In various embodiments, each of mass storage devices 210 is a hard disk drive. In one embodiment, each of mass storage devices 210 is a 4 TB hard disk drive with a Serial Advance Technology Attachment (SATA) interface.

In the embodiment shown in FIG. 2, each backplane 208 carries 16 mass storage devices 210 on a face of the backplane. A backplane may, however, carry any number of mass storage devices. In some embodiments, different backplanes within a data storage module carry a different number of mass storage devices. In some embodiments, one or more of the backplanes in a data storage module carries separate mass storage devices on separate faces of the backplane. The faces that carry mass storage devices may be opposite faces of the backplane. Where the backplane is vertically-oriented, the backplane can, in some embodiments, carry mass storage devices on opposite vertical faces of the backplane. For example, in the illustrated embodiment, vertically-oriented backplanes 208 each carry 16 mass storage devices on opposite vertical faces of the respective backplane, thus carrying a total of 32 mass storage devices per backplane. Vertical faces of a backplane may refer to faces with a surface extending along a primarily vertical plane.

System 200 includes bus 212a, 212b, and 212c. Bus 212a couples data control module 204 with data storage module 206a. Bus 212b couples data control module 204 with data storage module 206b. Bus 212c couples data control module 204 with data storage module 206c. Buses 212a, 212b, and 212c may each include one or more cables between data control module 204 and data storage modules 206a, 206b, and 206c. Each of buses 212a, 212b, and 212c may provide a connection for data input/output between data controller 204 and one of the data storage modules. In some embodiments, each of buses 212a, 212b, and 212c may provide for data I/O on multiple channels (for example, four channels). Each of data storage modules 206a, 206b, and 206c may be assigned a separate identifier.

In various embodiments, data access and transfer between a data controller and data storage modules in a system may be carried out by way of any suitable computer bus. In some embodiments, data access and transfer is carried out by way of a Serial attached SCSI (SAS) bus. In some embodiments, data access and transfer is carried out by way of a Serial Advance Technology Attachment (SATA) bus.

In some embodiments, connections within each of storage modules 206a, 206b, and 206c may include chaining backplanes within a data storage module. In some embodiments, connections within each of storage modules 206a, 206b, and 206c may include coupling backplanes with an expander device within a data storage module. For example, as illustrated in FIG. 2, the backplanes 208 are each coupled to bus 212a by way of a respective connection pathway 214 to an expander device 216. Bus 212a couples to expander device 216, such that each backplane 208 is coupled to data controller 204 via bus 212a, expander device 216, and a respective communication pathway 214. In some embodiments, a bus 212 can include multiple connections to expander device 216.

In some embodiments, each of backplanes 208 includes an expander chip. The expander chip may enable communication with the various mass storage devices 210. Each of backplanes 208 may also include a cascading port for chaining backplanes 208 one to another. In some embodiments, backplanes 208 includes circuitry for conditioning power to mass storage devices 210. In certain embodiments, backplanes 208 may each include a power supply for mass storage devices 210 on the backplane.

For the sake of clarity, the backplanes and mass storage devices are shown only for data storage module 206a. The backplanes and mass storage devices for data storage modules 212b and 212c may be similar to those of data storage module 212a.

Each backplane may include an output for each of the installed mass storage devices 210. In one embodiment, the data input/output interface to backplanes includes four channels. In one embodiment, each of mass storage devices 210 has a 500 GB storage capacity.

Although 3 modules are shown in FIG. 2, in various embodiments any number of data storage modules may be coupled to a data controller.

Figure 3:
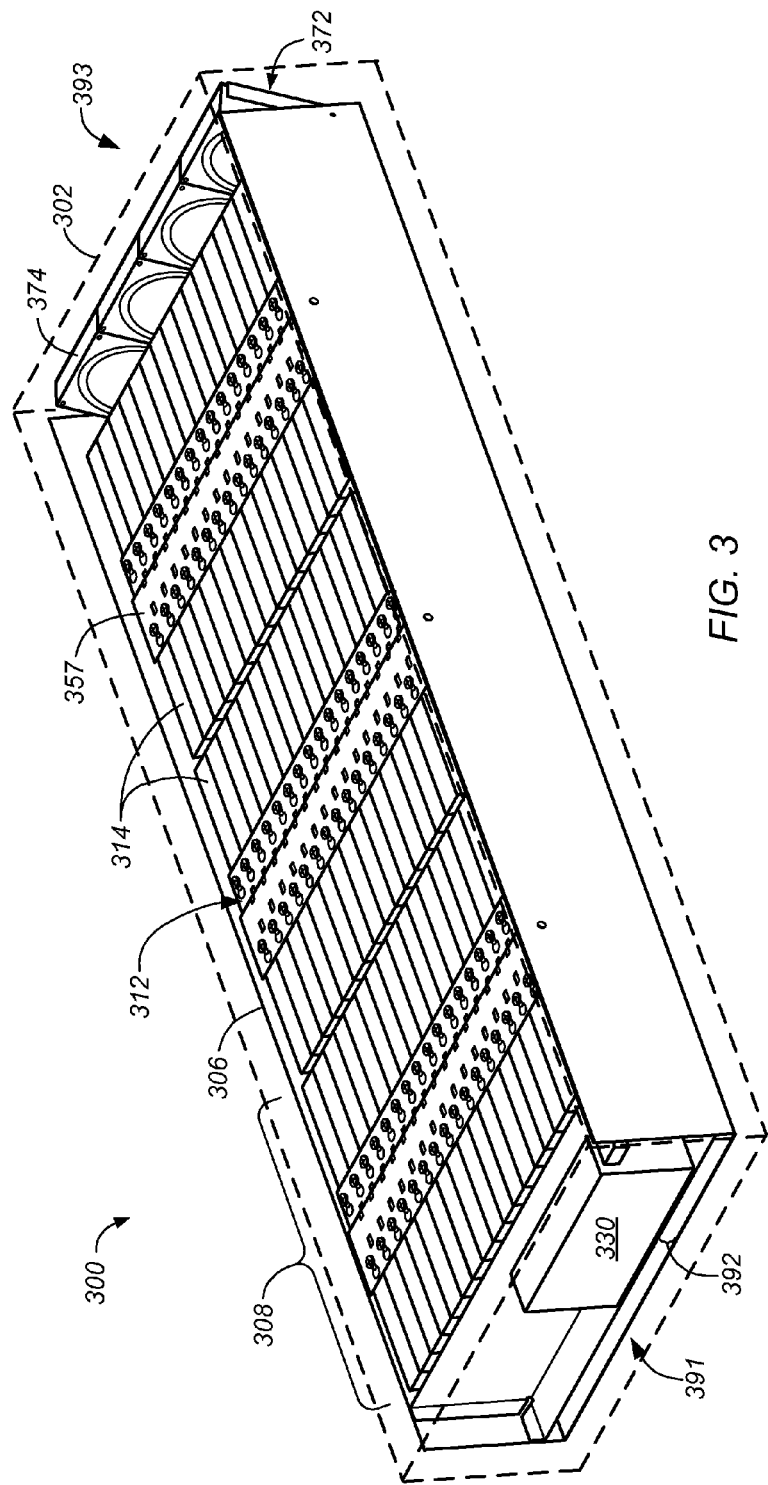
FIG. 3 illustrates a data storage module having mass storage devices installed on multiple vertically-oriented backplanes according to some embodiments.

FIG. 3 illustrates a data storage module having mass storage devices installed on multiple vertically-oriented backplanes according to some embodiments. System 300 includes data storage module 302. In some embodiments, data storage module 302 is mounted in a rack (not shown).

Data storage module 302 includes data storage module chassis 306, data storage assemblies 308, and power supply unit 330. Data storage assemblies 308 include backplane circuit board assemblies 312, also referred to herein as "backplanes", and mass storage devices 314. As shown in the illustrated embodiment, backplane circuit board assemblies 312 may be mounted in a primarily vertical orientation in data storage module chassis 306.

In various embodiments, a chassis for a module may include, or be used in combination with, various structural elements and components for support, mounting, and environmental protection of the elements of the module, such as enclosures, mounting plates, covers, panels, or mounting rails.

Mass storage devices 314, which may include one or more hard disk drives, are installed on backplane circuit board assemblies 312. An installed mass storage device 314 may be electrically coupled to a backplane circuit board assembly 312 via coupling of one or more pairs of complementary electrical connectors of the mass storage device and the backplane circuit board assembly, where the installed mass storage device is communicatively coupled to a data control module via the backplane circuit board assembly. As shown in the illustrated embodiment, mass storage devices 314 may be installed in a primarily horizontal orientation. In some embodiments, mass storage devices 314 are installed such that the installed length that extends perpendicular to the face of the backplane to which the respective mass storage device is installed is the largest dimension of the mass storage device.

In some embodiments, and as shown in FIG. 3, a backplane circuit board assembly 312 may include a horizontally-oriented retention bar 357 that couples to mass storage devices 314 installed on the backplane circuit board and secures the mass storage devices 314 from collisions, side shock, etc.

Power supply unit 330 may be coupled to one or more of the backplane circuit board assemblies 312. Power supply unit 330 may supply power to one or more backplane circuit board assemblies 312 and mass storage devices 314 coupled to the one or more backplane circuit board assemblies 312. In some embodiments, a power supply 330 is coupled to a board that delivers power to one or more of the backplanes 312. In some embodiments, such a board includes one or more expanders, including expander device 216 illustrated and discussed above with reference to FIG. 2, for data connections involving one or more mass storage devices 314.

In some embodiments, data storage module 302 is approximately 3U in height. In some embodiments, data storage module 302 extends along a full depth of a rack, such that various components, including a rack-level power distribution unit and air moving device, are precluded from being mounted in the rack interior, and external to the data storage module chassis interior, at a common elevation with the data storage module 302.

In some embodiments, a chassis for a module may include, or be used in combination with, various structural elements and components for support, mounting, and environmental protection of the elements of the module, such as enclosures, mounting plates, covers, panels, or mounting rails. In some embodiments, the chassis at least partially encompasses a chassis interior of the data storage module. In the illustrated embodiment of FIG. 3, for example, the chassis 306 encompasses bottom and side ends of the chassis interior, as well as front ("inlet") 391 and rear ("exhaust") 393 ends, and leaves unencompassed at least the top end of the chassis interior. In some embodiments, a chassis may fully encompass a chassis interior.

Encompassment of one or more ends of a chassis interior should be understood to encompass one or more structural elements substantially bounding an end of one or more particular ends of an interior space, excepting at least particular portals that are utilized in association with operations of one or more components within the interior space. For example, a portion of chassis 306 that covers a front end of the data storage module 302 may be understood to encompass at least the front end, despite the presence of one or more front vents 392 in the front of data storage module chassis 306, as the one or more front vents 392, also referred to herein as air inlets, are understood to be associated with operations of one or more components within the interior space of the data storage module. Similarly, vents associated with power supply unit 330, portals associated with electrical connectors, communication pathway connectors, etc. may be discounted in considering one or more ends of an interior space to be encompassed by one or more portions of a chassis.

In various embodiments, a computing unit includes a power supply that conforms to an industry-recognized standard. In some embodiments, a power supply for a computing unit has a form factor in accordance with an industry-recognized standard. In one embodiment, power supply unit 330 has a standard 1U form factor. Examples of other standards for a power supply and/or a power supply form factor include 2U, 3U, SFX, ATX, NLX, LPX, or WTX.

In the embodiment shown in FIG. 3, data storage module 302 includes one power supply unit and further includes 96 mass storage devices. A computer system may, however, have any number of mass storage devices, power supply units, or other components.

In some embodiments, a data storage module 302 includes one or more internal air moving devices. The one or more air moving devices may be coupled to the chassis 306 of the data storage module 302 at least partially in a chassis interior of the chassis. For example, FIG. 3 illustrates an array 372 of air moving devices 374 coupled to chassis 306 at the rear end 393 of the chassis 306.

In some embodiments, one or more air moving devices induce airflow through an interior of a data storage module, including a chassis interior at least partially encompassed by a chassis of the data storage module. The air moving devices may induce the airflow via inducing a pressure difference, also referred to hereinafter as a pressure gradient, across the chassis interior. Such a pressure gradient may result from one or more air moving devices reducing the air pressure in the chassis interior, increasing the air pressure in the chassis interior, etc. Air moving devices may include air moving devices of one or more types and configurations known to those having skill in the art, including air fans, air blowers, etc. As referred to herein, air blowers may be distinguished from air fans as air moving devices that exhaust an airflow with a changed direction and pressure relative to an airflow received into the blower, and air fans may be understood to include air moving devices that exhaust an airflow with a substantially similar direction relative to an airflow received into the fan. In the illustrated embodiment, for example, air moving devices 374 include one or more air fans that exhaust air in a substantially similar flow direction as the flow direction of air received into the air fans.

In the illustrated embodiment, air moving devices 374 in array 372 may draw air from front end 391 into the chassis interior at least partially encompassed by chassis 306 through the front vent 392, and between various mass storage devices 314 and backplanes 312 in the chassis interior, based on reducing air pressure on an exhaust end 393 of the chassis. The resulting pressure gradient across the chassis interior of chassis 306 may induce an airflow through the data storage module 302 from the inlet end 391 to the exhaust end 393.

In some embodiments, array 372 is a discrete cooling system that provides discrete cooling of the particular data storage module 302 in system 300 to the exclusion of any other modules that may be present in system 300. For example, where system 300 includes a rack into which multiple data storage modules 302 are mounted, each data storage module may include an array 372 of air moving devices 374 that provide cooling of components within the particular module 302 to which the devices 374 are coupled, to the exclusion of components in any of the other modules 302 mounted in the rack. As used hereinafter, "discrete cooling" refers to cooling of an individual "discrete" module by a particular cooling system, where the particular cooling system provides cooling exclusively to the individual discrete module. In some embodiments, a discrete cooling system that provides discrete cooling of a particular data storage module 302 includes one or more air moving devices that are comprised in a discrete cooling module that is indirectly coupled to the chassis 306 via directly coupling with a rack to which the chassis 306 is coupled. Such a discrete cooling module can include an air cover that at least partially encompasses a portion of the chassis 306 interior, an air moving device coupled to the air cover, etc.

Figure 4:
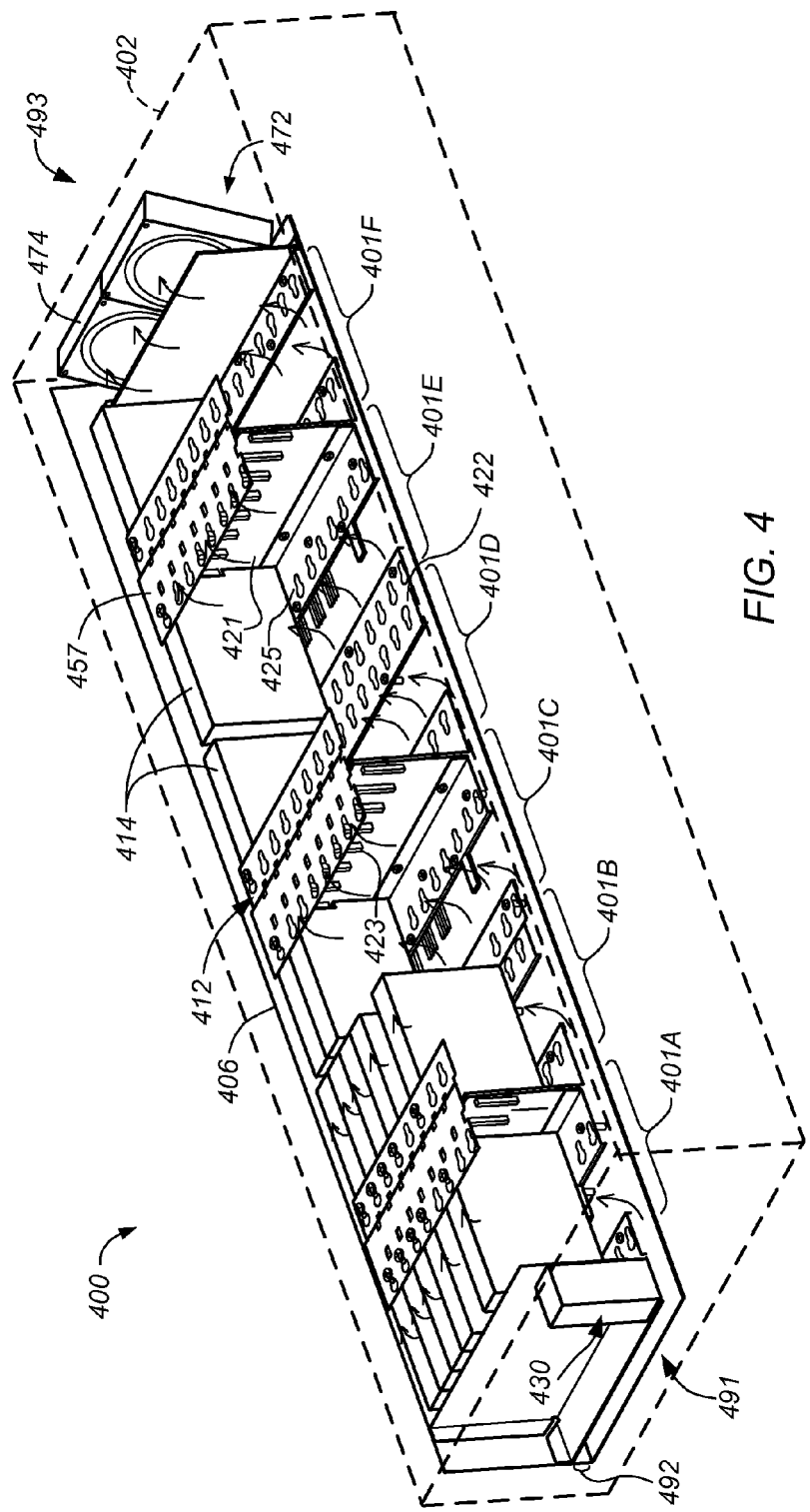
FIG. 4 illustrates a cross-sectional view of a data storage module having mass storage devices installed on multiple vertically-oriented backplanes according to some embodiments.

FIG. 4 illustrates a cross-sectional view of a data storage module having mass storage devices 414 installed on multiple vertically-oriented backplanes 412, and at least one power supply unit 430, according to some embodiments. In some embodiments, a data storage module includes one or more backplanes that are coupled to the data storage module chassis in a primarily vertical orientation, hereinafter referred to interchangeably as vertically-oriented backplanes coupled to the chassis.

In some embodiments, a vertically-oriented backplane circuit board assembly 412 may include a vertically-oriented backplane circuit board 421, to which mass storage devices 414 are electrically coupled via coupling with complementary circuit board connectors 423. Vertically-oriented backplane circuit board assemblies 412 may include one or more horizontally-oriented mounting plates 425 upon which one or more mass storage devices 414 are mounted, such that the mass storage devices 414 rest on the mounting plates and transfer at least a portion of their structural load to such mounting plates. The one or more horizontally-oriented mounting plates 425 can align a given mass storage device 414 with a corresponding connector. In some embodiments, and as shown in FIG. 4, a backplane circuit board assembly 412 may include a horizontally-oriented retention bar 457 that couples to mass storage devices 414 installed on a backplane circuit board 421 of backplane circuit board assembly 412 and secures the mass storage devices 414 from collisions, side shock, etc. In some embodiments, one or more horizontally-oriented mounting plates 422 that are separate from one or more backplane circuit board assemblies 412 may be mounted in chassis 406 and may at least partially structurally support one or more mass storage devices 414 installed on backplanes 412.

A vertically oriented backplane 412 may include a circuit board 421 with opposite vertical faces, one or both of which include connectors 423 that can electrically couple the circuit board 421 with one or more mass storage devices, including mass storage devices 414, via coupling of complementary electrical connectors of the mass storage devices 414 with electrical connectors 423.

In some embodiments, each vertically-oriented backplane is comprised of one or more components that preclude airflow through the components. For example, a backplane circuit board may be substantially solid in construction and independent of manufactured air vents in the circuit board 421, so that air is precluded from flowing directly through the circuit board 421 between opposite vertical faces of the vertically-oriented backplane circuit board assembly 412. As a result, where vertically-oriented backplanes 412 are coupled to a chassis in a chassis interior, the vertically-oriented backplanes may at least partially establish vertically-oriented air passages at least partially bounded by one or more vertical faces of the backplanes, so that at least a portion of the vertically-oriented backplanes each direct at least a portion of airflow along a vertical face of the backplane.

As shown in the illustrated embodiment of FIG. 4, each of the vertically-oriented backplanes 412 is independent of air vents in the circuit boards 421 of the respective backplanes 412, and air flowing through the chassis interior of chassis 406, from front vent 492 at the inlet end 491 of the chassis 406, is directed into one of various vertically-oriented air passages 401A-F bounded on one or more vertical planes by vertical faces of one or more of the backplanes 412, vertical faces of the chassis 406, etc. Air can be directed through the interior of the chassis 406 to an exhaust end 493 of the chassis via one or more air moving devices 474 in an array 472 of air moving devices.

As shown in the illustrated embodiment, some embodiments of a data storage module 402 include one or more air passages extending beneath one or more of the vertically-oriented backplane circuit board assemblies 412 coupled to the chassis 406. The one or more air passages may be established at least in part by an open space between a portion of the chassis bounding a bottom end of the chassis interior and one or more lower ends of the backplane circuit board assemblies 412 and mass storage devices 414 coupled thereto. Air entering the chassis interior from an inlet end of the chassis may be directed along the one or more air passages beneath the backplanes 412 and may be supplied, through one or more of the vertically-oriented passages 401A-F, in one or more vertically-directed upwards air flows across one or more of the mass storage devices 414 and vertical faces of one or more backplanes 412. As illustrated by the flow arrows, an entirety of the air flow into the chassis interior from the front vent 492 may be directed through at least a portion of the air passages beneath one or more of the backplanes 412, and portions of the airflow may be supplied upwards through the various vertically-oriented passages 401A-F. In some embodiments, the various upwards-directed portions of the inlet airflow flow upwards through passages 401A-F substantially in parallel with each other, and each airflow portion removes heat from heat producing components of devices bounding the respective passage 401A-F through which the air passes upwards. For example, airflow portions flowing upwards through passage 401B may remove heat exclusively from mass storage devices 414 installed in the air passage 401B, relative to mass storage devices 414 installed in one of the other air passages 401A, C-F. As a result, in some embodiments, each airflow portion flowing through each vertically-oriented air passage 401A-F removes heat in parallel and independently of each other.

As shown by the flow arrows in the illustrated embodiment, the one or more air passages extending beneath one or more backplanes 412 supply upwards-directed portions of the inlet airflow from front vent 492 to the various vertically-oriented air passages 401A-F, such that separate portions of the inlet airflow remove heat from components in separate air passages bounded by separate vertical faces of the various backplanes. The air passage may supply the various upwards portions of the airflow based at least in part upon various factors, including impedance of the airflow at openings to each respective air passage 401A-F that diverts portions of the airflow into the respective passages, a chimney effect that induces a separate portion of the airflow to rise through separate openings to the separate air passages 401A-F, some combination thereof, or the like.

Figure 5:
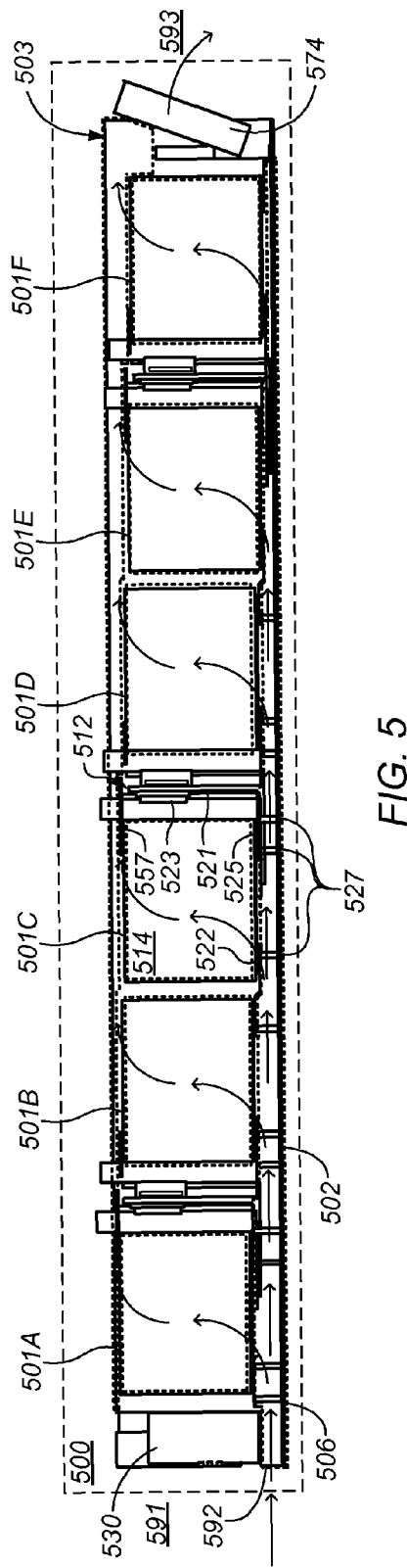
FIG. 5 illustrates a side view of a data storage module having mass storage devices installed on multiple vertically-oriented backplanes according to some embodiments.

FIG. 5 illustrates a side view of a data storage module having mass storage devices installed on multiple vertically-oriented backplanes according to some embodiments. Data storage module 500 includes a chassis 506 that at least partially encompasses an interior of the data storage module. The at least partially-encompassed interior is also referred to hereinafter as a "chassis interior". Various components are coupled to the chassis in the chassis interior, including one or more power supply units 530 and various vertically-oriented backplane circuit board assemblies (hereinafter referred to interchangeably as "backplanes") 512 to which mass storage devices 514 are installed on each of opposite vertical faces of the backplanes 512.

In the illustrated embodiment, three separate vertically-oriented backplanes 512 are coupled to the chassis 506 in the chassis interior, and each backplane is coupled with at least one mass storage device 514 on each of opposite vertical faces of the backplane. In some embodiments, a backplane may be configured to couple with at least one mass storage device on a single vertical face of the backplane. In some embodiments, and as shown in the illustrated embodiment, at least some backplanes are coupled to a chassis via one or more support posts 527 that position the coupled backplane 512 in a particular position in the chassis interior, both relative to the inlet end 591 and exhaust end 593 of the chassis 506 and in elevation relative to bottom and top ends of the chassis interior.

In some embodiments, a vertically-oriented backplane 512 includes one or more vertically-oriented backplane circuit boards 521 and one or more horizontally-oriented components. The vertically-oriented backplane circuit board 521 includes the connector 523 that establishes an electrical connection with an installed mass storage device 514. As the backplane circuit board 521 is vertically-oriented, and a mass storage device 514 that is installed on the backplane 512 couples with at least an electrical connector 523 on a vertical face of the circuit board 521, the mass storage device may be installed on the backplane 512 in a horizontal orientation. For example, as shown in the illustrated embodiment, a mass storage device 514 installed on a vertically-oriented backplane 512 may be oriented on its "side", where the largest dimension of the mass storage device 514 is the length of the device extending substantially perpendicular to the plane of the vertical face of the backplane 512 to which the mass storage device 514 is coupled via connector 523. As a result, a mass storage device that includes an electrical connector for data transfer and access on a "bottom" of the device can be coupled to the backplane where the device is oriented on its "side" to align the "bottom" side of the device with one or more connectors 523 on the vertically-aligned backplane 512.

In some embodiments, including the illustrated embodiment, multiple vertically-oriented backplanes 512 are mounted in multiple locations through a depth of the chassis 506. As a result, one or more sets of mass storage devices 514 are installed on one or more vertically-oriented backplanes 512 in a location in the chassis 506 that is adjacent to other sets of mass storage devices 514 installed on other backplanes 512, including the one or more mass storage devices 514 installed on backplane 512 and at least partially located in passage 501C, which are adjacent to mass storage devices 514 located in passages 501B and 501D. In some embodiments, a mass storage device 514 installed on a backplane 512 that is adjacent to other backplanes and mass storage devices is not adjacent to a front end 591 of the chassis 506. In some embodiments, a mass storage device 514 installed on a backplane 512 that is adjacent to other backplanes and mass storage devices is not adjacent to a rear end 593 of the chassis 506.

In some embodiments, where a mass storage device includes one or more electrical connectors on its "bottom" side, the device's largest dimension may be a dimension that does not bound its "bottom" side. For example, in the illustrated embodiment, where a mass storage device 514 is oriented on its "side" so that a connector on the "bottom" side is coupled to a connector 523, the largest dimension may be a length of the device along one or more sides that extend substantially perpendicular to the "bottom" side of the mass storage device. In some embodiments, a chassis with vertically-oriented backplanes that couple to devices on sides that do not include the largest dimension of the mass storage device, such as in the illustrated embodiment, may have a reduced height relative to a chassis with horizontally-oriented backplanes that couple to mass storage devices on sides that do not include the largest dimension of the mass storage device. As a result, because a chassis including vertically-oriented backplanes may be shorter in height than a chassis including horizontally-oriented backplanes, a given rack may include a greater number of data storage modules with respective chasses including vertically-oriented backplanes, relative to the number of data storage modules with respective chasses including horizontally-oriented backplanes. As a result, such a given rack including data storage modules with respective chasses including vertically-oriented backplanes may include a greater number of mass storage devices, thereby including a greater mass storage device density, than a rack including data storage modules with respective chasses including horizontally-oriented backplanes.

In some embodiments, where a vertically-oriented backplane 512 includes one or more horizontally-oriented components, one or more of the horizontally-oriented components can physically couple with a mass storage device coupled to the backplane 512 to mount the mass storage device on the horizontally-oriented components, such that the horizontally-oriented components include one or more structural coupling elements that couple with the mass storage device to enable one or more of structural support, positioning, structural load transfer, stabilization, shock absorption, some combination thereof, or the like with regard to the mass storage device, while the one or more vertically-oriented backplane circuit boards of the backplane include one or more electrical connectors 523 that physically couple with the mass storage device to electrically couple the backplane circuit board with the mass storage device, thereby enabling data transfer, access, storage operations, some combination thereof, or the like between the mass storage device and at least the backplane circuit board. In the illustrated embodiment, for example, vertically-oriented backplane 512 includes one or more vertically-oriented backplane circuit boards 521, to which mass storage devices 514 can be coupled on at least one vertical face via one or more electrical connectors 523, and horizontally-oriented mounting plates 522, 525 and retention bar 557. The mounting plates 522, 525 may include one or more guiding elements, coupling elements, etc., as discussed and illustrated further below, that may physically couple with one or more portions of a mass storage device 514 to mount the mass storage device 514 on the mounting plates 522, 525 to enable one or more of structural support, positioning, structural load transfer, stabilization, shock absorption, some combination thereof, or the like with regard to the mass storage device and at least the mounting plates. In particular, mounting plates 522, 525 may absorb some or all of the structural load of the mounted mass storage device 514 and transfer the load to the chassis 506 via one or more posts 527.

In some embodiments, a data storage module includes one or more air passages that extend through at least a portion of the chassis interior of the module. Such air passages can direct and supply air between various points in the chassis interior. For example, air passages can supply air from an ambient environment to flow in heat transfer communication with one or more heat producing components and remove heat from same. In another example, air passages can remove air that has removed heat from one or more heat producing components, also referred to herein as exhaust air, from the chassis interior to an ambient environment, thereby removing the removed heat from the chassis interior. Heat removal from heat producing components in the chassis interior via one or more airflows allows operations utilizing such components without excessive heat buildup in the chassis interior, which can damage equipment.

In some embodiments, a data storage module includes one or more air passages that extend beneath one or more vertically-oriented backplanes in the chassis interior. Such an air passage, also referred to herein as an "inlet air plenum", can be bounded on a lower side by at least a portion of the data storage module chassis and bounded on at least portions of an upper side by lower portions of the one or more vertically-oriented backplanes, where the lower portions of the one or more vertically-oriented backplanes at least partially direct airflow on the upper side of the inlet air plenum and the portion of the data storage module chassis directs airflow on the lower side of the inlet air plenum. The inlet air plenum may be in flow communication with an air inlet on an inlet end of the chassis and may extend from the inlet end towards the exhaust end of the chassis. The inlet air plenum can, in some embodiments, supply air that is received through the air inlet from an ambient environment through the inlet air plenum and beneath one or more of the backplanes. Supplying one or more airflows beneath backplanes and from the air inlet at the inlet end towards the exhaust end can enable air to be supplied from the inlet air plenum at various points in the chassis interior along at least a portion of the length of the chassis, from the inlet end towards the exhaust end.

For example, in the illustrated embodiment, data storage module 500 includes a chassis 506 with three vertically-oriented backplane circuit board assemblies 512, where an inlet air plenum 502 extends in a portion of the chassis interior beneath each of the three backplanes 512. The inlet air plenum 502 also extends beneath the mass storage devices 514 installed on the backplanes 512, and air being supplied through the inlet air plenum 502 from the vent 592 at the inlet end 591 towards the exhaust end 593 is not in heat transfer communication with heat producing components in the mass storage devices 514, backplanes 512, etc. when still flowing through the plenum 502. As a result, an airflow through plenum 502 can be supplied, in one or more various portions of the airflow, to the various mass storage devices 514 without being preheated by other mass storage devices. Such non-preheated air supplied from the plenum 502 to each of the mass storage devices 514 may have a substantially common temperature, such that the capacity to remove heat from mass storage devices 514 installed on the backplane 512 that is coupled to the chassis at a position that is most proximate to the exhaust end 593 may be similar to the capacity to remove heat from mass storage devices 514 installed on the backplane 512 that is coupled to the chassis at a position that is most proximate to the inlet end 591. Such similar ("uniform") heat removal capacity for mass storage devices at various positions in the chassis interior can enable more optimal operation capacity for mass storage devices, regardless of which backplane in the chassis to which the device is coupled. In some embodiments, one or more various components can be mounted at least partially in the inlet air plenum 502. For example, one or more of a data control module that is configured to access, control, etc. one or more of the mass storage devices 514, one or more power supply units, some combination thereof, or the like can be mounted in plenum 502 at least partially beneath at least one of the backplane assemblies 512.

As shown in the illustrated embodiment, in some embodiments, one or more air gaps at an upper end of an inlet air plenum extending beneath one or more backplanes enables a portion of the airflow through the inlet air plenum to be supplied from the plenum to flow in heat transfer communication, and remove heat from, one or more heat producing components located in one or more separate air passages. For example, as shown, where the upper boundary of the inlet air plenum 502 is at least partially defined by components of the vertically-oriented backplanes 512 in the chassis interior, gaps between adjacent backplanes 512 can provide portals through which a portion of the airflow through the inlet air plenum 502 can be supplied. As shown in the illustrated embodiment, each gap in the upper portion of the inlet air plenum 502 may lead to a separate one of substantially parallel air passages 501A-F through the chassis interior. In some embodiments, each air passage 501 may flow in heat transfer communication with one or more sets of heat producing components of one or more mass storage devices 514. Each air passage may extend substantially in parallel with one or more other air passages being supplied with air from various air gaps to the inlet air plenum, so that air being supplied from the inlet air plenum to the passages is supplied in separate parallel portions that flow substantially in parallel through the chassis interior and remove heat from one or more separate sets of heat producing components.

In some embodiments, air passages that supply air from an inlet air plenum across, in heat transfer communication with, etc. one or more heat producing components are supplied air through one or more various mechanisms. For example, a pressure gradient may exist across an air passage, such that air is supplied from the inlet air plenum at a higher pressure than the pressure of air exiting the air passage. In another example, an air passage may extend vertically from the inlet air plenum, such that air rises from the inlet air plenum through the passages due to the chimney effect, flow impedance, some combination thereof, etc. In the illustrated embodiment, for example, each air passage 501A-F supplied by the inlet air plenum 502 is positioned over an air gap in an upper end of the plenum 502, and respective and separate portions of the airflow through the plenum 502 rise from the plenum, through the respective gaps, and through the respective passages 501A-F. In some embodiments, each passage is at least partially bounded and defined by one or more vertical faces of one or more backplanes.

In some embodiments, each passage is at least partially bounded by one or more vertically-oriented components separate from one or more backplanes. For example, in the illustrated embodiment, one or more passages 501 may be bounded by a vertical face of at least one backplane 512 and one or more vertical components of chassis 506. One or more passages may be bounded by a vertically-oriented element positioned distal to an end of a mass storage device 514 that is coupled to a vertically-oriented backplane circuit board 521. A vertical component may be mounted on a horizontally-oriented mounting plate 522 that is separate from a backplane 512, where the vertical component extends between at least two sets of mass storage devices 514 installed on separate backplanes 512, where the vertical component provides a physical barrier between at least two respective passages 501 that each pass across respective ones of the at least two sets of mass storage devices 514. For example, a vertical component may be mounted between passages 501B and 501C, where the vertical component bounds at least a portion of each air passage 501B, 501C and air is precluded from passing between the two passages 501B, 501C.

For example, a vertically-oriented backplane 512 may include one or more components, including vertically-oriented backplane circuit board 521, that preclude airflow though the board 521, so that air flowing through a passage 501 adjacent to that board 521 flows along the board 521 but does not flow through it between opposite vertical faces of the board 521. As a result, air flowing through a passage 501 is directed in a vertical direction through the passage by at least one vertical face of a vertically-oriented backplane. For example, in the illustrated embodiment, each passage 501 extends adjacent to at least one vertically-oriented backplane 512, and air flowing through a respective passage 501 may be directed to flow upwards based at least in part upon the adjacent backplane 512 precluding an airflow through the backplane between opposite vertical faces thereof.

In some embodiments, one or more air passages in a chassis interior include one or more air passages that extend above one or more vertically-oriented backplanes. Such air passages, referred to herein as exhaust air plenums 503, may be supplied with air from one or more air passages 501. As air supplied from the passages 501 may have removed heat from one or more heat producing components in heat transfer communication with the respective passage, including one or more components of a mass storage device 514 installed on a backplane such that the mass storage device is located at least partially in the passage, air supplied from one or more air passages 501 may include exhaust air. In some embodiments, the exhaust air plenum supplies air, including exhaust air, supplied from one or more air passages 501 to the exhaust end 593 of the chassis. Where an air exit is positioned at the exhaust end of the chassis, the air supplied to the exhaust end of the chassis may exit the chassis, thereby removing any removed heat from the chassis interior. In some embodiments, plenum 503 is absent from data storage module 500, and air exiting one or more passages 501 may exit the module 500 via one or more air conduits, passages, etc. in communication with exits of at least one of the passages 501. For example, one or more air conduits in communication with the upper end of at least one of the air passages 501 may remove exhaust air exiting the upper end of the at least one air passage 501 from the module 500.

In some embodiments, one or more of the vertically-oriented backplanes coupled to the chassis in the chassis interior, at least some of the mass storage devices 514 installed on backplanes coupled to the chassis, some combination thereof, or the like are coupled in a "staggered" configuration. As used hereinafter, a "staggered" configuration of backplanes, mass storage devices, etc. refers to a configuration of backplanes, mass storage devices, etc. through a chassis interior that have different elevations relative to one or more adjacent backplanes, mass storage devices, etc. Such differences in elevation may be partial differences in elevation, where the upper and lower ends of a given backplane may be different from corresponding upper and lower ends of one or more adjacent backplanes, but the lower end of a given backplane may be at a lower elevation relative to an upper end of an adjacent backplane. A staggered configuration of backplanes can include a sequence of backplanes along a length of the chassis from one end to an opposite end of the chassis, where each backplane extends substantially perpendicular to the length of the chassis, where each backplane in the sequence has a lower elevation in the chassis interior relative to an adjacent preceding backplane in the sequence and a higher elevation in the chassis interior relative to an adjacent following backplane in the sequence.

In some embodiments, one or more air passages extending through at least a portion of the chassis interior includes varying cross-sectional areas, perpendicular to the length of the one or more air passages along the length of the chassis from the inlet end towards the exhaust end. The varying cross-sectional areas may be established based at least in part upon varying elevations of one or more backplanes coupled in a staggered configuration. For example, in the illustrated embodiment, where backplanes 512 are coupled to chassis 506 in a staggered configuration from the inlet end towards the exhaust end, where the inlet-proximate backplanes 512 are elevated at least partially above adjacent following backplanes 512, the inlet air plenum 502 extending from the inlet end includes cross sectional areas, perpendicular to the direction of flow through plenum 502 from the inlet end towards the exhaust end, that decrease from the inlet end towards the exhaust end through the plenum. In some embodiments, varying cross-sectional areas of one or more air passages may be established based at least in part upon varying elevations of one or more mass storage devices 514 installed on backplanes 512 in the chassis 506.

The cross-sectional area of an air passage may change in a discontinuous manner along the length of the air passage. For example, the cross-sectional area of an air passage may progressively change in discrete steps along the length of the air passage. As shown in the illustrated embodiment, the cross-sectional area of plenum 502 progressively decreases along its length from inlet end 591 towards exhaust end 593 in discrete step changes. In addition, the cross-sectional area of plenum 503 progressively increases along its length from inlet end 591 towards exhaust end 593 in discrete step changes. Based at least in part upon the varying cross-sectional area along a length of an air passage, the air passage may be understood to "narrow" or "expand" corresponding to respective increases or decreases in its cross-sectional area. For example, plenum 502 progressively narrows along its length from the inlet end 591 towards the exhaust end 593, and plenum 503 progressively expands along its length from the inlet end 591 towards the exhaust end 593.

In some embodiments, the variation of cross sectional area at particular locations along a length of an air passage corresponds with a change in backplane elevation. The three illustrated backplanes 512 have progressively reduced elevations in the chassis interior from the inlet end 591 towards the exhaust end 593, and respectively installed mass storage devices 514 have correspondingly progressively reduced elevations in the chassis interior. As a result, the upper end of the plenum 502 is reduced along its length at each backplane 512 and installed mass storage devices 514, such that the plenum progressively narrows in discrete step changes corresponding to a particular respective backplane and coupled components. In some embodiments, the variation of cross sectional area at particular locations along a length of an air passage corresponds with a change in mass storage device elevation.

In some embodiments, a change in elevation between adjacent backplanes, mass storage devices, etc. in a chassis interior can enable a portion of an airflow through an air passage extending beneath the backplanes to be diverted into another air passage extending between the adjacent backplanes. Where a first backplane is at least partially elevated above a succeeding backplane, and an air plenum passes an airflow beneath the backplanes from under the first backplane to at least under the succeeding backplane, at least a lower portion of the succeeding backplane, being at a lower elevation than a corresponding lower portion of the first backplane, may extend at least partially beneath the first backplane, such that at least a portion of the airflow through the plenum impinges on the lower portion of the succeeding backplane. That portion of the airflow may be diverted by at least the lower portion of the succeeding backplane upwards through an air passage between the first and succeeding backplanes.

In some embodiments, where one or more air passages progressively narrow from an inlet end to an exhaust end of the chassis, the air passages progressively impede an airflow through the air passages from the inlet end towards the exhaust end. Airflow may be progressively impeded corresponding to changes in cross-sectional area of the air passages. For example, where air plenum 502 progressively narrows from inlet end 591 towards exhaust end 593, the airflow through plenum 502 may become progressively more impeded, also referred to as being progressively impeded, as the cross sectional area of the plenum 502 decreases along its length. Progressive impedance of flow through the plenum 502 at each change in cross sectional area can divert at least a portion of the airflow in the plenum 502 to be supplied out of the plenum 502 into at least one air passage 501. The increased impedance may create a pressure gradient that diverts air through passages with reduced relative impedance relative to the plenum 502 at the point of increased impedance.

In some embodiments, progressively increased impedance of airflow through the inlet air plenum 502 can enable airflow rates out of the plenum 502 through each of the air passages 501 to maintain one or more flow properties without one or more predetermined tolerance ranges. For example, progressively impeding flow through the plenum 502 can enable airflow out of the plenum 502 and into passage 501F to have an airflow velocity, air mass flow rate, air volumetric flow rate, etc. that is similar to a corresponding flow characteristic of airflow out of the plenum 502 at a relatively less impeded location in the plenum 502 and through passage 501A.

In some embodiments, where the progressive narrowing of plenum 502 is established based at least in part upon the staggered configuration of the backplanes 512, the backplanes may be coupled to the chassis 506 in a staggered configuration that establishes an inlet air plenum 502 that progressively narrows such that airflow through the plenum is progressively impeded along its length in the direction of flow and maintains one or more airflow characteristics that exceed one or more predetermined threshold values of the flow characteristics.

In some embodiments, the backplanes 512 are coupled to the chassis 506 in a staggered configuration to establish air inlet and exhaust plenums, and air passages at least partially bounded by the backplanes 512, that enable an inlet airflow received into the chassis interior from an ambient environment to be supplied through a progressively-narrowed inlet air plenum beneath one or more backplanes, where separate portions of the airflow are supplied to separately remove heat from separate heat producing components coupled to separate backplanes. The airflow through the inlet air plenum may comprise a laterally-directed airflow. The separate portions of the airflow may be supplied in parallel through several separate parallel air passages, such that the separate portions of the airflow each comprises one or more upwards-directed vertical airflows. The separate portions of the airflow, in some embodiments, enter one or more exhaust air plenums subsequent to removing heat from one or more heat producing components, and the exhaust plenum may direct the airflow, which may include exhaust air, to the exhaust end of the chassis to exit the chassis interior. The airflow through the exhaust plenum may comprise a laterally-directed airflow. In the illustrated embodiment, flow arrows illustrate a lateral flow of air through plenums 502 and 503, and upwards-directed flows of separate portions of the airflow through plenum 502 through each of passages 501. Plenum 502 supplies separate portions of air received from an ambient environment at the inlet end 591 of the chassis 506 through front vent 592 to each of the passages 501A-F, and plenum 503 supplies the separate portions of air exiting passages 501A-F to exit the chassis interior at exhaust end 593 via one or more air moving devices 574 positioned at the exhaust end.

In some embodiments, a chassis 506 has a length that extends substantially through an entire depth of a rack in which the data storage module 500 is mounted. As a result, chassis 506 may have sufficient length to preclude various components from being mounted in the rack at a common elevation with the data storage module 500. For example, the chassis may be sufficiently long that any remaining space in the rack interior precludes coupling a rack-level power distribution unit to the chassis 506 in the rack interior. Similarly, the chassis may preclude mounting an air moving device in the rack interior at a common elevation with the data storage module 500. Where a rack comprises multiple such data storage modules 500, mounting of various components, including air moving devices, at any point in the rack interior may be precluded. Such data storage modules 500 may be referred to as including backplanes coupled to a chassis in a full-depth configuration, where the chassis extends substantially along a full depth of the rack in which it is mounted.

In addition, in some embodiments where a data storage module 500 includes a chassis 506 that extends approximately along the full depth of a rack in which the chassis 506 is mounted, various components that may be traditionally mounted at a common elevation with a data storage module in the rack are excluded from doing so. For example, a rack may include a power distribution unit (PDU) door mounted on a front (inlet) end of the rack, where the PDU door includes one or more rack PDUs that distribute power to one or more servers in the rack via cable connections, bus connections, etc. In addition, a rack may include a fan door on a rear (exhaust) end of the rack, where the fan door includes one or more air moving devices, including air fans, air blowers, etc., that move air through one or more modules mounted in the rack. In some embodiments, a full-depth data storage module may preclude such components, including PDU doors, rack PDUs, fan doors, air moving devices, etc., from being coupled to the rack, at least at a common elevation with the full-depth data storage module 500, because the full-depth module 500 has sufficient chassis 506 length that the remaining space in the rack interior at a common elevation with the full-depth module is insufficient to accommodate such other components via one or more of the front end of the rack, the rear end of the rack, etc. Such components that are excluded from accommodation in the rack can include components that provide one or more capabilities that may be shared by multiple data storage modules in a rack. For example, where a rack comprises a standard 19-inch rack, as will be understood with regard to EIA-310, revision D, a full-depth data storage module includes a chassis 506 that extends approximately along a full depth of the 19-inch rack, such that an insufficient amount of space within the opening of the rack, which can measure 17.72-inches in width, is available at a front end of the rack to accommodate a PDU that is mounted in a PDU door that, when closed, projects the PDU through the front side of the rack towards the front side of the chassis 506, a fan door that includes one or more air moving devices that project through a rear side of the rack towards the rear side of the chassis, etc.

In some embodiments, air moving device 574 is part of a discrete cooling system that provides discrete cooling of the particular data storage module 500 to the exclusion of any other modules. For example, where module 500 is mounted in a rack with multiple similar modules 500, where each module substantially occupies the length of the rack at a common elevation with the respective module, each data storage module 500 may include an array of air moving devices 574 that provide cooling of components within the particular module 500 to which the devices 514 are coupled, to the exclusion of components in any of the other modules 500 mounted in the rack.

In some embodiments, air moving devices 574 are coupled to a chassis 506 proximate to an exhaust end 593 of the chassis at least partially in the chassis interior. An air moving device 574 coupled to the chassis proximate to an exhaust end can induce airflow through the chassis interior, which can include some or all of airflow through the plenum 502, passages 501A-F, and plenum 503 and may be referred collectively to as "chassis airflow". The air moving device 574 may move air out of the chassis interior to reduce the air pressure in at least a portion of the chassis interior relative to the ambient environment proximate to the inlet end. As a result, a pressure gradient from the ambient environment to the air moving device may be established, which may induce some or all of the chassis airflow.

In some embodiments, one or more of the air moving devices 574 are at least partially adjustable with regard to orientation. An air moving device may include one or more actuators that can operate to change the relative orientation of the air moving device 574 relative to the chassis 506. The actuator may be commanded to change the relative orientation by one or more controller devices, which may command the orientation change based at least in part upon one or more characteristics associated with the chassis airflow. The characteristics may include one or more of air temperature, air pressure, mass flow rate, volumetric flow rate, flow velocity, some combination thereof, or the like at one or more positions within or outside of the chassis interior of data storage module 500.

FIG. 6A-C and FIG. 7A-C illustrate installing a mass storage device on a backplane according to some embodiments. In some embodiments, mass storage device 602 is coupled to a connector 612 on a vertical face of a vertically-oriented backplane circuit board 610.

In some embodiments, a mass storage device is electrically coupled to a vertically-oriented backplane circuit board based at least in part upon being mounted on one or more mounting plates to align an electrical connector of the mass storage device to physically couple with a complementary connector of the vertically-oriented backplane circuit board. One or more mounting plates, retention bars, some combination thereof, or the like may be coupled to the mass storage device to secure the device in a particular position. As a result, the device may be isolated from collisions with other components, side-shocks, etc. based at least in part upon the mounting plates, retention bars, and coupling elements thereto.

As shown in FIGS. 6A and 7A, a mass storage device 602 may include at least two lower coupling elements 608, 609 which can fit into corresponding keyhole slots 605, 607 on mounting plates 604, 606 to mount the mass storage device 602 on the mounting plates 604, 606. One or more of coupling elements 608, 609 may include one or more isolation damping shoulder screws. In some embodiments, placing the mass storage device 602 on the mounting plates 604, 606 to insert the coupling elements 608, 609 into the corresponding keyhole slots 605, 607 will at least partially align an electrical connector of the mass storage device (not shown) with a corresponding electrical connector 612 on a vertically-oriented backplane circuit board 610 that is adjacent to the mounting plates 604, 606. Inserting the coupling elements 608, 609 into the corresponding keyhole slots 605, 607 may align the constraining latch rail 622 of the constraining latch 620 with a latch interface 626, which may include a slot into which the latch element can engage. The mass storage device 602 may include a constraining latch 620, which includes a latch rail 622 with latch element 627 and release tab 624. The mass storage device 602 may include an upper coupling element 630, which may include one or more isolation damping shoulder screws.

As shown in FIGS. 6B and 7B, the mass storage device 602, mounted on mounting plates 604, 606 via inserting the lower coupling elements 608, 609 of the mass storage device 602 into corresponding keyhole slots 605, 607, can be slid along upper surfaces of one or more of mounting plates 604, 606 towards the electrical connector 612 to couple an electrical connector of the mass storage device 602 (not shown) with the complementary electrical connector 612, thereby electrically coupling the mass storage device 602 with the vertically-oriented backplane circuit board 610. In some embodiments, including the illustrated embodiment, the keyhole slots 605, 607 to which coupling elements 608, 609 of mass storage device 602 are inserted include narrowing portions that narrow towards the backplane circuit board 610 on each mounting plate, such that the coupling elements 608, 609 can be slid at least partially through the corresponding keyhole slot narrowing portions as the mass storage device 602 is slid toward the electrical connector 612. In certain embodiments, sliding coupling elements 608, 609 at least partially through the corresponding keyhole slot narrowing portions secures the coupling elements 608, 609 from being decoupled from the keyhole slots, thereby securing the mass storage device 602 to the mounting plates 604, 606.

In some embodiments, sliding mass storage device 602 along upper surfaces of one or more of mounting plates 604, 606 towards the electrical connector 612 to couple an electrical connector of the mass storage device 602 (not shown) with the complementary electrical connector 612 includes engaging a constraining latch 620 with a latch interface 626 associated with the vertically-oriented backplane. Engaging a latch 620 with a latch interface 626, in some embodiments, secures the position of the mass storage device 602 relative to at least a portion of the vertically-oriented backplane, including connector 612. As a result, engaging the latch 620 can secure the mass storage device 602 in a coupled position relative to at least the connector 612.

In some embodiments, such as illustrated in at least FIG. 6-7, the latch interface 626 can include a slot in a mounting plate 606, and the latch 620 can include a latch rail 622 with a latch element 627 that, when inserted through the latch interface 626, engages the latch 620 to secure ("lock") the mass storage device 602 in position. In some embodiments, and as illustrated by the directional arrows in at least FIG. 7B, sliding the mass storage device 602 along the upper surfaces of the mounting plates 604, 606 can include sliding the latch element latch element 627 along the upper surface of mounting plate 606 until the latch element 626 encounters the latch interface latch element 627, at which point the latch element 627 inserts through the latch interface 626 to engage the latch 620. The latch element 627, which can include one or more protrusions, may be forced to insert through the encountered latch interface 626 based at least in part upon one or more spring mechanisms associated with latch 620. It should be understood that a spring mechanism associated with latch 620 may include one or more types of spring mechanisms and that the types of spring mechanisms that may be associated with latch 620 should be understood to be encompassed by the types of spring mechanisms known in the relevant art.

In some embodiments, the latch 620 includes a spring mechanism and latch rail 622 coupled to a side of the mass storage device 602, and a latch tab 624 extending over at least one or more other sides of the mass storage device and encompassing at least a portion of the latch rail 622. For example, as shown in FIG. 6-7, the latch rail 622 can include a strip of material that is coupled to a side of the mass storage device 602 via coupling elements 608, 609. The latch rail 622 may include an angled portion that angles away from the surface of the mass storage device to which the latch rail 622 is coupled, with the latch element 627 at the end of the angled portion of the latch rail 622 that can insert into the latch interface 626 to engage the latch 620.

The angled portion of the latch rail 622 can include a spring mechanism that forces the latch element 627 of the latch rail 622 away from the surface of the mass storage device 602 in the absence of a substantially opposite force. For example, where the mass storage device 602 is resting on the mounting plates 604, 606, and the latch element 627 of the latch rail 622 is not aligned with the latch interface 626, as illustrated in FIG. 7B, the upper surface of mounting plate 606 may force the angled portion of the latch element against the surface of the mass storage device 602. When the latch element 627 of the latch rail 622 is aligned with the latch interface 626, also referred to as the latch rail 622 encountering the latch interface 626, the spring mechanism comprised in the angled portion of the latch rail 622 may force the latch element 627 into the latch interface 626 to engage the latch 620.

As shown, the latch tab 624 may extend over one or more surfaces other than the surface to which the latch rail 622 is coupled via elements 608, 609 and encompass a portion of the latch rail 622. The illustrated latch tab 624 encompasses at least a portion of the angled portion of the latch rail 622, and pulling the latch tab 624 upwards, as shown in FIG. 7C, can pull the angled portion of the latch rail 622 towards the surface of the mass storage device 602, overcoming the force of the spring mechanism and removing the latch element 627 from the latch interface 626, thereby disengaging the latch 620.

As shown in FIGS. 6C and 7C, the mass storage device 602 can be "unlocked" from a secured position relative to at least a portion of the vertically-oriented backplane circuit board 610 based at least in part upon releasing the latch 620 from being engaged with the latch interface 626. Releasing the constraining latch 620 may include manipulating a latch tab 624 encompassing a portion of the latch rail 622, where manipulating a position of the tab 624 manipulates the position of one or more portions of the latch rail 622, including manipulating the position of the latch element 627 relative to the latch interface 626. In certain embodiments, pulling the tab 624 in a direction away from the latch interface 626 disengages the corresponding latch rail 622 from the latch interface 626, releasing the latch 620. Where the latch interface 626 is on a horizontally-oriented mounting plate 606, such as illustrated in FIGS. 6C and 7C and with particular reference to the directional arrows in FIG. 7C, releasing the latch 620 may include pulling upwards on a tab 624 to pull the latch element 627 upwards from the interface 626.

In some embodiments, the mass storage device 602 can be uninstalled from a vertically-oriented backplane based at least in part upon sliding the mass storage device away 602 from the connector 612 along the upper surfaces of the mounting plates 604, 606 to align the coupling elements 608, 609 of the mass storage device 602 with a widest portion of the corresponding keyhole slots 605, 607. The widest portion of the keyhole slots may have a size sufficient to accommodate the corresponding coupling elements, while the narrower portions of the keyhole slots are sufficiently narrow to preclude the coupling elements from being removed from the mounting plate without sliding back to the widest portion.

In some embodiments, sliding the mass storage device 602 to align coupling elements 608, 609 with a widest portion of the corresponding keyhole slots 605, 607 includes decoupling an electrical connector of the mass storage device 602 with the corresponding complementary connector 612, thereby decoupling the mass storage device 602 from the vertically-oriented backplane circuit board 610 of the vertically-oriented backplane. In some embodiments, the mass storage device 502 can be slid along the upper surfaces of mounting plates 604, 606 upon the latch 620 being released, as discussed above. In some embodiments, upon aligning coupling elements 608, 609 with a widest portion of the corresponding keyhole slots 605, 607, the mass storage device 602 can be lifted away from the mounting plates 604, 606, where the coupling elements 608, 609 are lifted out of the corresponding keyhole slots 605, 607, thereby uninstalling the mass storage device from the vertically-oriented backplane.

Figure 8A:
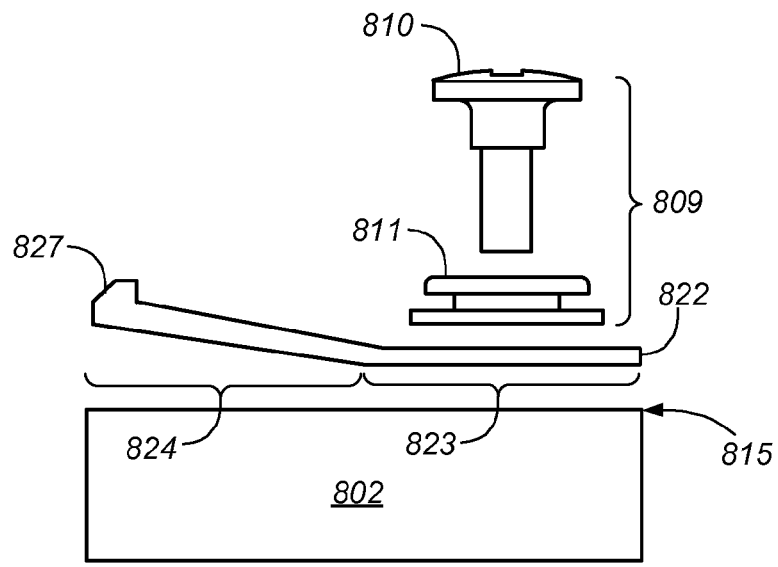
FIG. 8A-B illustrate coupling a latch element to a mass storage device according to some embodiments.
Figure 8B:
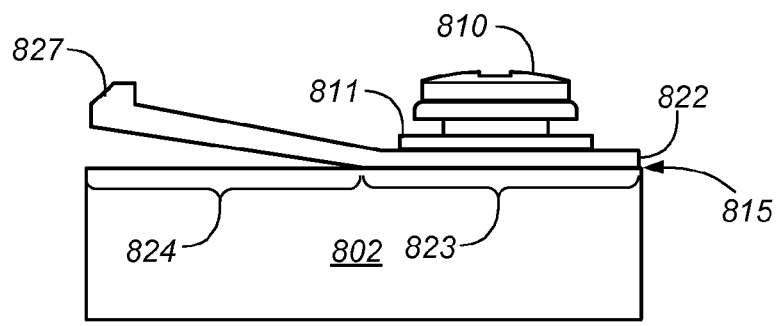

FIG. 8A-B illustrate coupling a latch rail to a mass storage device according to some embodiments. As shown, latch rail 822 can be coupled to a proximate surface 815 of mass storage device 802 via one or more coupling elements, including coupling element 809.

In some embodiments, including the illustrated embodiment, a coupling element 809 includes one or more shoulder screws 810 and one or more isolation damping grommets 810. As shown, in FIG. 8B, the latch rail 822 can be coupled to mass storage device 802, via coupling element 809, such that the latch rail 822 is positioned between the mass storage device 802 and a grommet 811 and at least a portion of a shoulder screw 810.

In some embodiments, the latch rail 822 can include a flush portion 823, also referred to herein as a "static rail", that extends substantially in parallel with the proximate surface 815 of the coupled mass storage device 802, such that the static rail 823 lies substantially flush with the mass storage device 802 surface 815 when the latch rail 822 is coupled to the mass storage device, as shown in FIG. 8B. In some embodiments, the latch rail 822 includes a latch element 827, which can include one or more projection elements as shown in the illustrated embodiment, that can be inserted at least partially into a latch interface to engage the latch element 827 and the coupled mass storage device 802 with the component in which the latch interface is located. The latch rail 822 may include an angled portion 824, which can include, as shown, one or more leaf spring elements, that angles away from the static rail 823. As a result, the leaf spring 824 may angle away from the proximate surface 815 of the mass storage device 802 to which the latch rail 822 is coupled, as shown in FIG. 8B. As the latch element 827 may be located on an end of the latch rail 822 that includes the leaf spring 824, the leaf spring 824 may project the latch element 827 away from the proximate surface 815 of the mass storage device 802.

In some embodiments, the leaf spring 824 comprises a spring mechanism that resists one or more forces that may push the latch element 827 towards the proximate surface 815 of the mass storage device 802. For example, as shown, the structure of the leaf spring 824 of the latch rail 822 may resist a force, normal to the proximate surface 815 of the mass storage device 802, that pushes the latch element 827 towards the proximate surface 815 and forces the leaf spring 824 to lie substantially flush with the proximate surface 815. Upon a release of such a normal force, the leaf spring 824 may return substantially to the initial angled configuration, such that the latch element 827 is pushed away from the proximate surface 815. As a result, where the proximate surface 815 is placed upon an upper surface of a mounting plate, the mounting plate may exert a force on the latch element 827, pushing it towards the proximate surface 815. The leaf spring 824 may resist the force, such that when the latch element 827 is aligned with a latch interface, and a force on the latch element 827 is released, the leaf spring 824 may force the latch element 827 at least partially into the latch interface, thereby engaging the latch.

Figure 9:
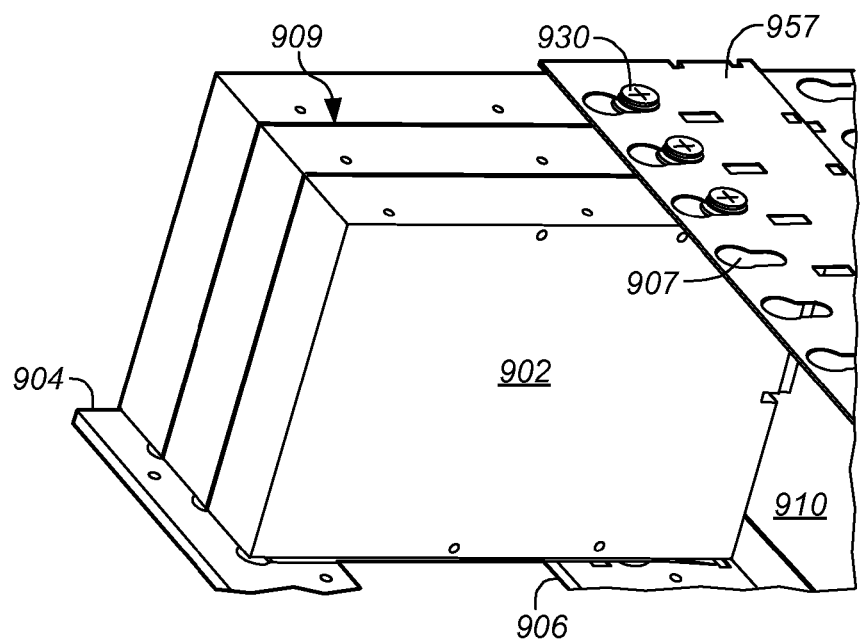
FIG. 9 illustrates installing a mass storage device on a backplane according to some embodiments.

FIG. 9 illustrates installing a mass storage device on a backplane according to some embodiments. As shown in the illustrations, installing a mass storage device on a vertically-oriented backplane can include coupling a retention bar to one or more portions of the mass storage device. The coupled retention bar, in some embodiments, stabilizes the position of mass storage device relative to one or more other components coupled to the vertically-oriented backplane, including one or more other mass storage devices installed to the same or another vertically-oriented backplane, stabilizes the mass storage device from side-shocks and potential collisions with the one or more other components as a result, etc.

As shown in the illustrated embodiment, where one or more mass storage device 902 are coupled to one or more components of a vertically-oriented backplane, including one or more mounting plates 904, 906 and a vertically-oriented backplane circuit board 910, a retention bar 957 may be separate coupled to each of the mass storage devices 902 via coupling of a coupling element 930 of each mass storage device 902 with a corresponding keyhole slot 907 of the retention bar 957. Coupling the respective upper surface of each mass storage device 902 the retention bar 957, where each keyhole slot 907 corresponding to each mass storage device coupling element 930 is space a particular distance apart, can stabilize a spacing of the upper surfaces of the mass storage device 902 to a particular spacing distance 909 between adjacent devices 902. Such stabilized spacing can mitigate the risk of collisions between adjacent mass storage devices 902 caused by side-shocks, other impacts on the chassis to which the backplane is coupled, etc.

Figure 10:
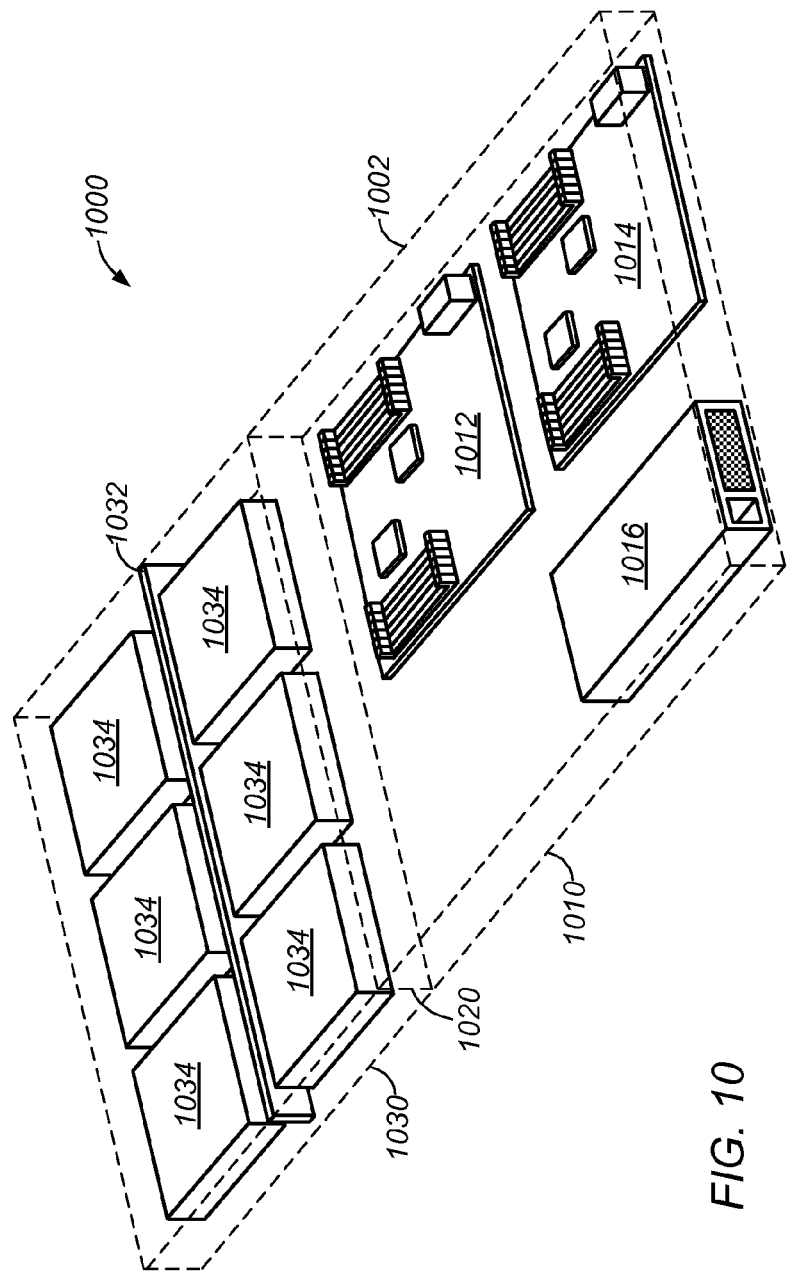
FIG. 10 illustrates a data control module that includes a data controller and multiple mass storage devices coupled to one or more backplane circuit boards according to some embodiments.

FIG. 10 illustrates a data control module that includes a data controller and multiple mass storage devices coupled to one or more backplane circuit boards according to some embodiments.

In various embodiments, a data storage system includes one or more data storage modules that are accessed from, and controlled by, a data controller external to the data storage modules. In some embodiments, one or more data controllers are included in one or more data control modules that are separate from one or more data storage modules in a data storage system. In some embodiments, a data control module is included in a portion of a data storage module. For example, a data control module may be mounted in an air plenum extending through at least a portion of a data storage module. In some embodiments, a data control module and one or more data storage modules coupled to the data control module are included within a rack.

Various data control modules can be coupled with various data storage modules. In some embodiments, one or more data control modules can include one or more data controller portions and one or more data storage portions. For example, data control module 1000, which includes a chassis 1002 that at least partially encompasses a chassis interior of module 1000, includes a data controller portion 1010 and a data storage portion 1030. The separate portions 1010, 1030 of the module 1000 may be separated in the chassis interior of chassis 1002 based at least in part on a divider element 1020. In some embodiments, a divider 1020 is absent from the chassis interior.

Data controller portion 1010 can include one or more control circuit board assemblies 1012, 1014 and power supply unit 1016. Control circuit board assemblies 1012, 1014 and power supply unit 1016 may be coupled to data control module chassis 1002. Control circuit board assemblies 1012, 1014 may access data on mass storage devices in one or more data storage modules. In some embodiments, the separate circuit board assemblies 1012, 1014 can access data on separate sets of mass storage devices, which may be in separate modules mounted on the rack.

In some embodiments, a data storage portion 1030 of a data control module 1000 includes one or more mass storage devices 1034. The mass storage devices can store data, similarly to mass storage devices in one or more data storage modules as discussed above with reference to at least FIG. 1-9. As a result, the mass storage devices 1034 in data storage portion 1030 can provide an additional storage capacity within a rack to which module 1000 is coupled. Data control module 1000 may thereby optimize space usage within the rack interior, where a portion of the rack interior at a common elevation with the data control module 1000 that would otherwise go unutilized by a data control module with a data control portion 1010 that extends through only a portion of the depth of the rack at a given elevation is utilized to house additional mass storage devices. For example, module 1000 may have a length that extends substantially entirely through a depth of a rack from an inlet end to an exhaust end of the rack. As a result, the rack interior space at a given elevation may be substantially occupied by the data control module 1000 and is precluded from accommodating one or more various other components in the rack interior at the given elevation, including one or more rack-level power distribution units, air moving devices external to module 1000, etc.

In some embodiments, the mass storage devices 1034 in data storage portion 1030 of module 1000 are installed on one or more vertically-oriented backplanes 1032 coupled to the chassis 1002, such that the mass storage devices 1034 are coupled in the chassis interior in a primarily horizontal orientation. As shown, data storage portion 1030 includes a vertically-oriented backplane 1032, to which multiple mass storage devices are coupled on opposite vertical faces of the backplane, such that a largest dimension of each mass storage device is a length of the device that extends substantially perpendicular to the proximate vertical face of backplane 1032 to which the device is coupled.

In some embodiments, backplane 1032 is coupled to chassis 1002 at an elevation in the chassis interior, so that one or more air passages extend beneath the backplane 1032. Air supplied into the chassis interior from an inlet end of module 1000, which may be proximate to an end of the data control portion 1010, may flow at least partially beneath backplane 1032, and separate portions of the airflow may be supplied upwards from the air passage in parallel flows along opposite vertical faces of the backplane 1032 and across one or more separate sets of mass storage devices 1034 to remove heat from one or more heat producing components of the mass storage devices 1034.

Power supply unit 1016 may be coupled to one or more of control circuit board assemblies 1012, 1014, backplane 1032, and mass storage devices 1034. Power supply unit 1016 may supply power to control circuit board assemblies 1012, 1014 backplane 1032, and mass storage devices 1034.

In some embodiments, data control module 1000 is about 1U in height. In various embodiments, a chassis 1002 for a data control module 1000 may include, or be used in combination with, various structural elements and components for support, mounting, and environmental protection of the elements of the module, such as enclosures, mounting plates, covers, panels, or mounting rails.

In certain embodiments, a data control module 1000 includes one or more internal air moving devices to induce an airflow through the interior space of module 1000. For example, in certain embodiments, a row of fans may be provided along the rear edge of data control module 1000. In certain embodiments, a computing unit may have no fans and/or no disk drives.

In certain embodiments, a power supply may be external to the storage or computing module. For example, in certain embodiments, control circuit board assemblies 1012, 1014 of data control module 1000 may receive power from a power supply external to data control module chassis 1002 (such as a rack-level power supply), and power supply unit 1016 may be omitted.

Figure 11:
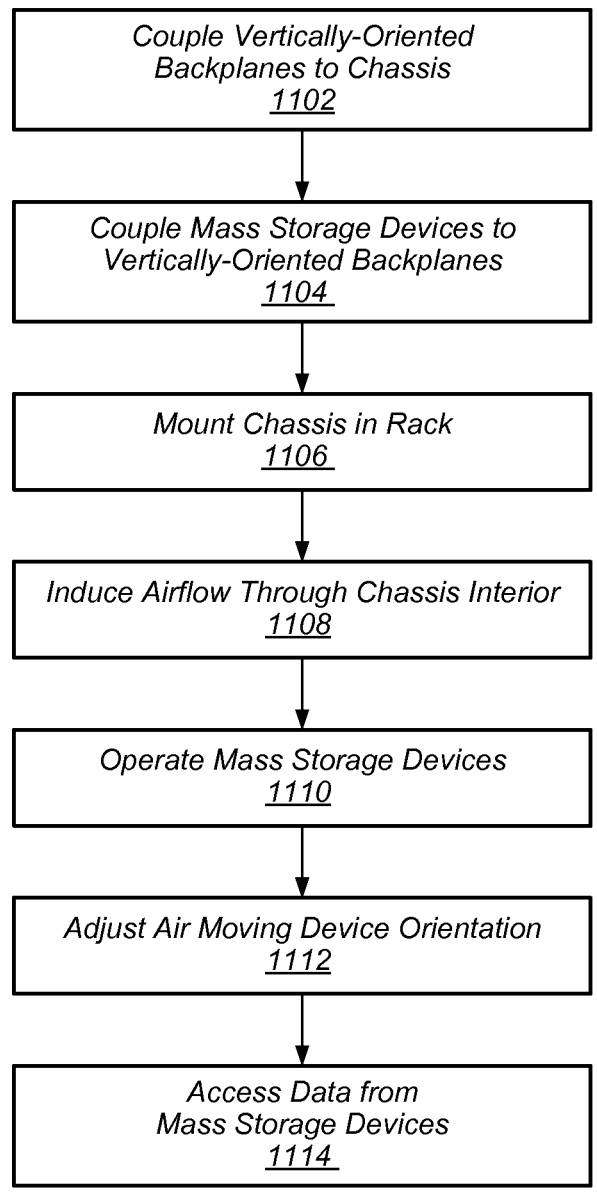
FIG. 11 illustrates a method of providing data storage that includes installing mass storage devices on two or more vertically-oriented backplanes coupled to a chassis, according to some embodiments.

FIG. 11 illustrates a method of providing data storage that includes installing mass storage devices on two or more vertically-oriented backplanes coupled to a chassis, according to some embodiments.

At 1102, two or more backplanes are coupled to a chassis, in a chassis interior, in a primarily vertical orientation, as vertically-oriented backplanes. One or more of the backplanes may include at least one vertically-oriented backplane circuit board that precludes airflow through the backplane circuit board between opposite vertical faces of the backplane, including opposite vertical faces one or more backplane circuit boards in the backplane. A backplane may include two vertically-oriented backplane circuit boards extending substantially in parallel, where the backplane precludes airflow between opposite vertical faces of the substantially parallel backplane circuit boards. At 1104, one or more mass storage devices are coupled to one or more of the vertically-oriented backplanes. The mass storage devices may include, for example, one or more hard disk drives. The mass storage devices may be in a horizontal orientation. In one embodiment, data storage and control are provided in a data storage module and data control module similar to those described above relative to FIGS. 1-10. In certain embodiments, the backplanes are communicatively coupled to one another and at least one of the backplanes is communicatively coupled to one or more data controllers. In some embodiments, the backplanes are communicatively coupled to at least one expander device and the at least one expander device is communicatively coupled to one or more data controllers. The one or more data controllers, which may include one or more data control modules, may be external to the chassis to which the backplanes are coupled. In certain embodiments, coupling the vertically oriented backplanes to the chassis and one or more mass storage devices to the backplanes at least partially established one or more air passages through at least a portion of the chassis interior, including one or more inlet air plenums extending from the inlet end of the chassis towards the exhaust end beneath at least one of the backplanes, one or more exhaust air plenums extending from the inlet end of the chassis towards the exhaust end above at least one of the backplanes, and one or more substantially parallel air passages extending from the inlet air plenum to the exhaust air plenum in the chassis interior and at least partially bounded by at least one vertical face of one of the vertically-oriented backplanes.

At 1106, the chassis is mounted in a rack. The chassis may be coupled to the rack via one or more mounting elements on the chassis or rack. The chassis may rest on one or more mounting elements of the rack, including one or more chassis support rails extending at least partially in parallel along a depth of the rack in parallel with the length of the chassis from the inlet end towards the exhaust end, one or more shelf modules, etc.

At 1108, airflow is induced through the chassis interior. Such a "chassis airflow," which may include some or all of an inlet airflow through an inlet air plenum, an exhaust airflow through an exhaust air plenum, and one or more substantially parallel airflows between the plenums in the chassis interior and at least partially bounded by at least one vertical face of one of the vertically-oriented backplanes. The chassis airflow may be induced based at least in part upon operation of one or more air moving devices. The air moving devices may be coupled to the chassis at least partially in the chassis interior. The air moving devices may be mounted on the rack in proximity to one or more ends of the chassis. In certain embodiments, an air moving device induces a chassis airflow in a chassis based at least in part upon moving air to reduce air pressure in at least a portion of a chassis interior relative to an ambient air pressure, thereby creating a pressure gradient between the portion of the chassis interior and the ambient environment that drives airflow into the portion of the chassis interior.

At 1110, some or all of the mass storage devices on the backplanes may be placed into operation. For example, the mass storage devices may provide storage capacity in a data center.

At 1112, one or more of the air moving devices are adjusted in orientation. Orientation of an air moving device may be adjusted based at least in part upon operation of one or more actuator devices. The actuator devices may operate to adjust the air moving device orientation to one or more particular orientations to direct the flow of exhaust air from the air moving device in a particular direction. The actuator devices may operate to adjust the air moving device orientation to one or more particular orientations based at least on one or more command signals received at the actuator devices from one or more controller devices. The controller devices may include one or more portions of a data control module.

At 1114, data from one or more of the mass storage devices is accessed. Data may be accessed by one or more data control modules communicatively coupled to the mass storage devices via one or more backplanes to which the mass storage devices are electrically coupled.

Upon failure of a mass storage device in a module, the module may be removed or withdrawn from its installed position in a rack. The failed mass storage device may be removed and replaced by way of the top of the module.

Figure 12:
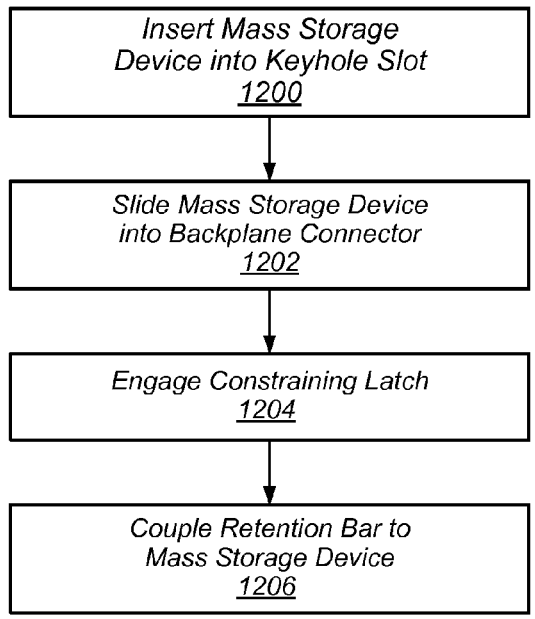
FIG. 12 illustrates a method of providing data storage that includes installing mass storage devices on a backplane, according to some embodiments.

FIG. 12 illustrates a method of providing data storage that includes installing mass storage devices on a backplane, according to some embodiments.

At 1200, at least a portion of a mass storage device is inserted into one or more keyhole slots of a mounting plate coupled to a chassis of a data storage module. The mounting plate may be oriented in a primarily horizontal orientation and may be a horizontally-oriented component of a vertically-oriented backplane, where the mounting plate may be adjacent to a vertically-oriented backplane circuit board. The mass storage device may include one or more interface elements, including one or more isolation damping shoulder screws, that can be inserted into a keyhole slot on the mounting plate. The mass storage device may include a constraining latch that can couple with a latch interface on one or more components of a vertically-oriented backplane, including a mounting plate, a vertically-oriented backplane circuit board, etc. The mass storage device may include an electrical connector. In certain embodiments, lowering the mass storage device into a keyhole slot on a mounting plate substantially aligns an electrical connector on a particular side of the mass storage device with a complementary electrical connector on a vertical face of a vertically-oriented backplane circuit board. In some embodiments, inserting a portion of a mass storage device into a portion of a mounting plate is comprised in mounting the mass storage device on the mounting plate.

At 1202, the mass storage device is slid towards an electrical connector on a vertically-oriented backplane circuit board to couple a complementary electrical connector on the mass storage device with the electrical connector, thereby electrically coupling the mass storage device to the vertically-oriented backplane circuit board via the complementary coupled connectors. In certain embodiments, sliding the mass storage device towards the electrical connector includes sliding the one or more interface elements of the mass storage device through a narrowing portion of the keyhole slot to secure the mass storage device to the mounting plate via the interface elements.

At 1204, the constraining latch is engaged to couple with a latch interface on one or more components of a vertically-oriented backplane, including a mounting plate, a vertically-oriented backplane circuit board, etc. In certain embodiments, the latch is engaged based at least in part upon the mass storage device being slid a sufficient threshold distance towards the electrical connector on the vertically-oriented backplane circuit board such that a latch element of the latch encounters a latch interface and engages with the latch interface to engage the latch. In certain embodiments, the engaged latch precludes the mass storage device from being decoupled from the electrical connector on the vertically-oriented backplane circuit board through sliding force exerted on the mass storage device alone.

At 1206, a retention bar is coupled to at least the mass storage device. The retention bar may be placed in contact with an upper surface of the mass storage device and coupled to the mass storage device via one or more coupling elements, including one or more isolation damping shoulder screws, to secure the position of the retention bar relative to the mass storage device. In certain embodiments, the retention bar is coupled to additional mass storage devices via additional coupling elements, where the retention bar ensures that the mass storage devices are spaced in particular relative positions to mitigate risk of collisions involving mass storage devices, side shock, etc. In some embodiments, coupling a retention bar to at least the mass storage device is optional.

Figure 13:
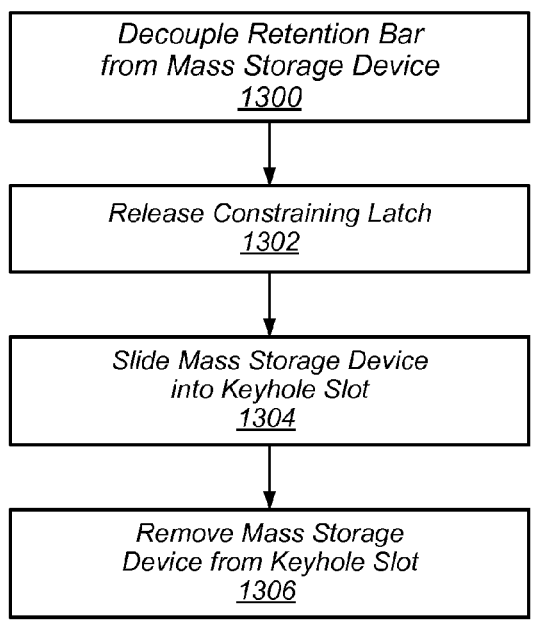
FIG. 13 illustrates a method of uninstalling mass storage devices from a backplane, according to some embodiments.

FIG. 13 illustrates a method of uninstalling mass storage devices from a backplane, according to some embodiments.

At 1300, a retention bar is decoupled from at least the mass storage device. Decoupling the retention bar may include removing one or more coupling elements coupling the retention bar to the mass storage device, including one or more shoulder screws. In certain embodiments, the retention bar is decoupled from multiple mass storage devices simultaneously. In some embodiments, including where a retention bar is not coupled to the mass storage device, decoupling the retention bar is omitted.

At 1302, the constraining latch is released. Releasing the constraining latch may include manipulating a tab coupled to the latch element, where manipulating a position of the tab manipulates the position of the latch element. In certain embodiments, pulling the tab in a direction away from the latch interface decouples the corresponding latch element from the latch interface, releasing the latch. Where the latch interface is on a horizontally-oriented mounting plate, releasing the latch may include pulling upwards on a tab to pull the latch element upwards from the interface.

At 1304, the mass storage device is slid away from the electrical connector on the vertically-oriented backplane circuit board to decouple the complementary electrical connector on the mass storage device with the electrical connector, thereby electrically decoupling the mass storage device from the vertically-oriented backplane circuit board. In certain embodiments, sliding the mass storage device away from the electrical connector includes sliding the one or more interface elements of the mass storage device through a widening portion of the keyhole slot.

At 1306, the mass storage device is removed from one or more keyhole slots of the mounting plate to decouple the mass storage device from the mounting plate. In certain embodiments, where the mass storage device is slid into a particular position relative to the keyhole slots, removing the mass storage device includes lifting the mass storage device away from the mounting plate, where the interface elements of the mass storage device are lifted out of the keyhole slots.

In some embodiments, mass storage devices in a data storage module are standard, off-the-shelf hard disk drives. Examples of suitable hard disk drive form factors may include 3.5", 5.25", and 2.5". In one embodiment, a standard 3.5" hard disk drive is installed such that the installed length of the hard disk drive extending substantially perpendicular to the vertically-oriented backplane circuit board to which the hard disk drive is coupled is the largest dimension.

For clarity, modules in many of the figures herein have been shown with a simple box outline around functional components. In various embodiments, a module or a chassis for a module may include an enclosure, a tray, a mounting plate, a combination thereof, as well as various other structural elements.

Although in the embodiments described above, some of the data storage modules have been described as being 3U in height, modules may in various embodiments be 2U, 4U, 5U, 6U or any other height or dimensions.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for storing data, comprising:
  a rack; and
  one or more data storage modules mounted on the rack, at least one of the data storage modules comprising:
    a chassis, having an inlet end and an exhaust end, that at least partially encompasses a chassis interior;
    two or more vertically-oriented backplanes coupled to the chassis in the chassis interior, wherein each of the vertically-oriented backplanes is configured to preclude airflow through the respective vertically-oriented backplane between opposite vertical faces of the respective vertically-oriented backplane;
    two or more mass storage devices installed on a vertically-oriented backplane of the two or more vertically-oriented backplanes, wherein:
      the vertically-oriented backplane includes:
        a first vertical face; and
        a second vertical face parallel to the first vertical face and facing opposite the first vertical face in a direction orthogonal to a plane defined by the first vertical face;

a first mass storage device of the two or more mass storage devices is installed on the first vertical face of the vertically-oriented backplane; and a second mass storage device of the two or more mass storage devices is installed on the second vertical face of the vertically-oriented backplane; and one or more air passages extending beneath at least the vertically-oriented backplane in the chassis interior from the inlet end towards the exhaust end, wherein the one or more air passages are each configured to supply an upwards-directed airflow along at least one of the first vertical face or the second vertical face of the vertically-oriented backplane to remove heat from at least one heat producing component of one or more mass storage devices installed on the at least one of the first vertical face or the second vertical face of the vertically-oriented backplane.

2. The system of claim 1, wherein:

the two or more vertically-oriented backplanes are coupled to the chassis in a staggered configuration, such that a particular one of the backplanes that is coupled to the chassis proximate to the inlet end is elevated relative to another one of the backplanes that is coupled to the chassis proximate to the exhaust end;

the one or more air passages are configured to supply the upwards-directed airflow with a laterally-directed airflow through the one or more air passages from the inlet end of the chassis; and the one or more air passages are further configured to progressively impede the laterally-directed airflow through the one or more air passages from the inlet end towards the exhaust end, wherein to progressively impede the laterally-direct airflow, the one or more air passages are configured to progressively narrow from the inlet end of the chassis towards the exhaust end of the chassis, based at least in part upon the staggered configuration of the two or more vertically-oriented backplanes.

3. The system of claim 1, wherein:

the at least one of the data storage modules comprises one or more air moving devices coupled to the exhaust end of the chassis and configured to induce at least the upwards-directed airflow;

wherein, to induce the upwards-directed airflow, the one or more air moving devices are configured to induce an air pressure difference between at least a portion of the chassis interior and an external environment, such that the upward-directed airflow is induced based at least in part upon the induced air pressure difference.

4. The system of claim 1, comprising:

at least one data control module mounted on the rack, wherein the at least one data control module is configured to access one or more of the mass storage devices in the at least one of the data storage modules; and at least one additional data storage module mounted on the rack at a common elevation with the at least one data control module in the rack, wherein the at least one additional data storage module comprises at least one vertically-oriented backplane configured to couple with at least one mass storage device on each of opposite vertical faces of the at least one vertically-oriented backplane.

5. A data storage module, comprising:

a chassis, having an inlet end and an exhaust end, that at least partially encompasses a chassis interior;

two or more vertically-oriented backplanes coupled to the chassis, wherein each of the vertically-oriented backplanes is configured to preclude airflow through the respective vertically-oriented backplane between opposite vertical faces of the respective vertically-oriented backplane and is further configured to couple with at least one of two or more mass storage devices on at least one vertical face of the opposite vertical faces of the respective vertically-oriented backplane, and a vertically-oriented backplane of the two or more vertically-oriented backplanes is configured to separately couple with at least two separate mass storage devices, wherein:

the vertically-oriented backplane includes:
a first vertical face; and
a second vertical face parallel to the first vertical face and facing opposite the first vertical face in a direction orthogonal to a plane defined by the first vertical face;

a first mass storage device of the at least two separate mass storage devices is configured to couple with the vertically-oriented backplane on the first vertical face of the vertically-oriented backplane; and a second mass storage device of the at least two separate mass storage devices is configured to couple with the vertically-oriented backplane on the second vertical face of the vertically-oriented backplane; and one or more air passages extending beneath at least at least one vertically-oriented backplane of the two or more vertically-oriented backplanes in the chassis interior from the inlet end towards the exhaust end, wherein the one or more air passages are each configured to supply an upwards-directed airflow along at least one of the opposite vertical faces of the at least one vertically-oriented backplane to remove heat from at least one heat producing component of at least one mass storage device coupled to the at least one of the opposite vertical faces of the at least one vertically-oriented backplane.

6. The data storage module of claim 5, wherein:

the two or more vertically-oriented backplanes are coupled to the chassis in a staggered configuration, such that a particular one of the backplanes that is coupled to the chassis proximate to the inlet end is elevated relative to another one of the backplanes that is coupled to the chassis proximate to the exhaust end; and the one or more air passages are configured to direct a laterally-directed airflow through the one or more air passages from the inlet end of the chassis to supply the upwards-directed airflow.

7. The data storage module of claim 6, wherein:

the one or more air passages are further configured to progressively impede the laterally-directed airflow through the one or more air passages from the inlet end towards the exhaust end, wherein to progressively impede the laterally-directed airflow, the one or more air passages are configured to progressively narrow from the inlet end of the chassis towards the exhaust end of the chassis, based at least in part upon the staggered configuration of the two or more vertically-oriented backplanes.

8. The data storage module of claim 5, comprising:

one or more exhaust air passages extending above at least one vertically-oriented backplane of the two or more vertically-oriented backplanes in the chassis interior from the inlet end towards the exhaust end, wherein the one or more exhaust air passages are each configured to supply an exhaust airflow, of air that has removed heat from at least one of the mass storage devices, to an external environment via the exhaust end of the interior space.

9. The data storage module of claim 8, comprising:
one or more air moving devices coupled to one of the inlet end of the chassis or the exhaust end of the chassis and configured to provide discrete cooling of each of the two or more mass storage devices;
wherein, to provide discrete cooling of each of the two or more mass storage devices, the one or more air moving devices are configured to induce a chassis airflow through the chassis interior from the inlet end of the chassis to the exhaust end of the chassis; and
wherein the chassis airflow comprises a laterally-directed airflow through the one or more air passages, the upwards-directed airflow along at least one of the opposite vertical faces of the at least one vertically-oriented backplane, and the exhaust airflow.

10. The data storage module of claim 9, wherein:
the one or more air moving devices are comprised in a discrete cooling module that is indirectly coupled to the chassis via directly coupling with a rack to which the chassis is coupled.

11. The data storage module of claim 5, comprising:
one or more data control modules mounted at least partially in the one or more air passages extending beneath at least the at least one vertically-oriented backplane, wherein the one or more data control modules are configured to access one or more of the mass storage devices coupled to at least one of the two or more vertically-oriented backplanes.

12. The data storage module of claim 9, wherein:
the one or more air moving devices each comprise an actuator configured to adjust an orientation of the one or more air moving devices based at least in part upon one or more characteristics associated with the chassis airflow.

13. The data storage module of claim 5, wherein:
the chassis is configured to accommodate a plurality of backplanes, each of the plurality of backplanes configured to mount one or more mass storage devices, in a full-depth configuration in the chassis interior; and
to accommodate a plurality of backplanes in a full-depth configuration, the chassis is configured to:
extend, from the inlet end of the chassis to the exhaust end of the chassis, along an entire depth of an interior of a rack to which the chassis is coupled from an inlet end of the rack to an exhaust end of the rack, such that a power distribution unit is excluded from coupling to the rack to extend into the inlet end of the rack at a common elevation with the chassis in the rack.

14. A method of providing data storage, comprising:
coupling two or more vertically-oriented backplanes to a chassis in a chassis interior at least partially encompassed by the chassis, wherein a vertically-oriented backplane of the two or more vertically-oriented backplanes is configured to:
separately couple with at least two separate mass storage devices, wherein:
the vertically-oriented backplane includes:
a first vertical face; and
a second vertical face parallel to the first vertical face and facing opposite the first vertical face in a direction orthogonal to a plane defined by the first vertical face;
a first mass storage device of the at least two separate mass storage devices is configured to couple with the vertically-oriented backplane on the first vertical face of the vertically-oriented backplane; and
a second mass storage device of the at least two separate mass storage devices is configured to couple with the vertically-oriented backplane on the second vertical face of the vertically-oriented backplane; and
preclude airflow through the respective vertically-oriented backplane between opposite vertical faces of the respective vertically-oriented backplane, such that each vertical face of the respective vertically-oriented backplane is configured to direct an upwards-directed airflow along the vertical face to remove heat from at least one heat producing component of at least one mass storage device coupled to the vertical face.

15. The method of claim 14, wherein:
coupling the two or more vertically-oriented backplanes to a chassis in a chassis interior at least partially encompassed by the chassis comprises:
coupling a particular one of the vertically-oriented backplanes to the chassis, proximate to the inlet end, at a particular elevation in the chassis interior; and
coupling another one of the vertically-oriented backplanes to the chassis, proximate to the exhaust end, at another elevation in the chassis interior;
wherein the particular elevation of the particular one of the vertically-oriented backplanes is at least partially greater than the other elevation of the other one of the vertically-oriented backplanes; and
wherein a lower portion, extending below a lowest elevation of the particular one of the vertically-oriented backplanes, of at least one vertical face of the other one of the vertically-oriented backplanes is configured to direct at least a portion of air flowing beneath a lowest elevation of the particular one of the vertically-oriented backplanes along the at least one vertical face in at least one upwards-directed airflow.

16. The method of claim 15, wherein:
coupling the two or more vertically-oriented backplanes to a chassis in a chassis interior at least partially encompassed by the chassis further comprises:
coupling at least the particular one of the vertically-oriented backplanes and the other one of the vertically-oriented backplanes to establish a laterally-directed progressively-narrowing air passage extending beneath at least the particular one of the vertically-oriented backplanes from an inlet end of the chassis towards an exhaust end of the chassis;
wherein the progressively-narrowing air passage is configured to progressively impede a laterally-directed airflow through the progressively-narrowing air passage from the inlet end towards the exhaust end.

17. The method of claim 14, comprising:
coupling one or more air moving devices, configured to provide discrete cooling of heat producing components within the chassis interior, to one of an inlet end of the chassis or an exhaust end of the chassis;

wherein, to provide discrete cooling of heat producing components within the chassis interior, the one or more air moving devices are configured to induce a chassis airflow through the chassis interior from an inlet end of the chassis to an exhaust end of the chassis;

wherein the chassis airflow comprises at least one of the upwards-directed airflows along at least one vertical face of at least one of the two or more vertically-oriented backplanes.

18. The method of claim 17, wherein:

the one or more air moving devices each comprise an actuator configured to adjust an orientation of the one or more air moving devices based at least in part upon one or more characteristics associated with the chassis airflow.

19. The data storage module of claim 5, wherein:

the at least two separate mass storage devices are configured to be horizontally oriented when the at least two separate mass storage devices are coupled to the vertically-oriented backplane.

* * * * *